United States Patent [19]
Ma et al.

[11] Patent Number: 5,748,126
[45] Date of Patent: May 5, 1998

[54] SIGMA-DELTA DIGITAL-TO-ANALOG CONVERSION SYSTEM AND PROCESS THROUGH RECONSTRUCTION AND RESAMPLING

[75] Inventors: Chingwo Ma, Danville; Inging Yang, Milpitas; Wei-Chan Hsu, San Jose, all of Calif.

[73] Assignee: S3 Incorporated, Santa Clara, Calif.

[21] Appl. No.: 612,691

[22] Filed: Mar. 8, 1996

[51] Int. Cl.$^6$ .................................................. H03M 3/00
[52] U.S. Cl. .................................. 341/143; 341/144
[58] Field of Search ........................ 341/143, 155, 341/144, 110, 150, 152

[56] References Cited

U.S. PATENT DOCUMENTS

| | | | |
|---|---|---|---|
| 5,268,688 | 12/1993 | Meyers et al. | 341/143 |
| 5,313,205 | 5/1994 | Wilson | 341/144 |
| 5,512,898 | 4/1996 | Norsworthy et al. | 341/155 |

OTHER PUBLICATIONS

Candy, James C. and Temes, Gabor C., "Oversampling Methods for A/D and D/A Conversion", *IEEE Press*, 1992, pp. 1–29.

Crochiere, Ronald E. and Rabiner, Lawrence R., "Interpolation and Decimation of Digital Signals—A Tutorial Review", Reprinted from *Proc. IEEE*, vol. 69, Mar. 1981, pp. 300–331 (pages in current version renumbered to 417–448).

Analog Devices AD1893 Data Sheet, pp. 1–20, Oct. 1994.

Gerald, C. F. and Wheatley, P. O., "Interpolating Polynomials", *Applied Numerical Analysis*, 3rd Edition, Chapter 3, pp. 171–181. (no date given).

*Primary Examiner*—Brian K. Young
*Attorney, Agent, or Firm*—Fenwick & West LLP

[57] ABSTRACT

A conversion system and method is disclosed for converting between digital and analog data signals. The conversion system comprises a signal input line for each digital data signal, a reconstructor-resampler unit for each digital data signal, a combiner, a modulator, a digital-to-analog converter, and a signal output line. Each signal line input couples to the respective reconstructor-resampler unit for the digital data signal. Each reconstructor-resampler unit then couples to a combiner which couples to a modulator. The modulator couples to the digital-to-analog converter that couples to the signal output line from which an analog output signal is produced. The reconstructor-resampler comprises a sampling member coupled to the signal line input and a polynomial interpolator member coupled to the sampling member and the modulator. Also, the modulator operates at a predetermined, or fixed, frequency regardless of the sampling frequency of the digital data signal. The steps of the conversion method include inputting a digital data signal having a sampling frequency, reconstructing and resampling the digital data signal to generate a resampled data signal, performing noise-shaping on the resampled data signal to generate a x-bit data signal from a modulator operating at a predetermined frequency regardless of the sampling frequency of any of the digital data signals, and converting the x-bit data signal to an analog data signal. In addition, an analog-to-digital conversion system and method is disclosed that comprises a signal line input, a decimator, a reconstructor-resampler a signal output line, and a modulator operating at a predetermined frequency to convert an analog data signal to a digital data signal.

33 Claims, 13 Drawing Sheets

$f(t)=f(n)+at+bt^2$; $f((n+1)T)=f(n+1)$, $f((n+2)T)=f(n+2)$.
Second order polynominal interpolation

SIGMA-DELTA DIGITAL-TO-ANALOG CONVERSION SYSTEM AND PROCESS THROUGH RECONSTRUCTION AND RESAMPLING

BACKGROUND

1. Field of The Invention

The present invention relates to a method and an apparatus for converting digital data input streams or signals to analog data output streams or signals, and in particular, for converting the data streams using a reconstructor-resampler with a sigma-delta modulator that operates at a fixed clock rate regardless of a sampling frequency applied to the digital data input stream.

2. Description of the Related Art

One of the major tasks for an audio subsystem of a computer is to playback or output audio signals. To maintain good sound quality, a high resolution (16-bit or more) Sigma-Delta Digital-to-Analog converter system is typically used to convert a digital data input signal into an analog data output signal.

A typical conversion system operates at a pre-defined clock rate that is usually tens to hundreds of times the input sampling frequency. A conventional converter system operates using the principle of "noise-shaping," in which a very crude, e.g., 1-bit, digital-to-analog conversion circuit is used to reproduce the analog signal. For example, in the conventional converter system, a 16-bit digital data input signal would be first processed by an interpolator to produce an upsampled signal. The digital data input signal would be sampled with a 64 oversampling ratio by being upsampled 4 times, filtered to remove high frequency harmonics from the upsampling, and then further upsampled 16 times. The upsampling is necessary to make the noise-shaping operation in a sigma-delta modulator more effective. Noise-shaping involves taking the noise spectrum of a data stream and moving it to a frequency band substantially outside of the signal bandwidth.

The upsampled signal is then forwarded to a sigma-delta modulator. The sigma-delta modulator performs the noise-shaping on the upsampled signal and produces a 1-bit output stream in which a low frequency quantization error is pushed to a very high frequency. The sigma-delta modulator produces a 1-bit data stream that can be converted to an analog signal much easier than the original 16-bit stream. Finally, the 1-bit data stream is sent through a digital-to-analog converter and a low-pass filter, which filters out the high frequency noise produced by the modulation process, and emerges as an analog data output signal.

The conversion system upsampling rate is fixed and requires a clock source that is set equal to the digital data input sampling frequency multiplied by the upsampling rate needed for the sigma-delta modulator. The clock source is typically a phase-locked loop to synthesize the required frequency. Under this approach, each time the digital data input sampling frequency changes, the clock rate must also be changed to be a proper multiple of the input sampling frequency. Therefore, the prior art requires multiple clock sources in order to process multiple digital input streams having different sampling frequencies. This is problematic because it greatly increases the hardware required to process digital input streams having different sampling frequencies.

In addition to requiring the clock rate to change every time the digital data input sampling frequency changes, the prior art also exhibits difficulties where two or more digital data input signals or digital audio streams must be played back simultaneously. These difficulties with the prior art include having additional timing circuits on a chip for each digital data stream input and requiring greater processing power for accomplishing the digital to analog conversion. For example, as will be discussed in greater detail below, when using an analog mixer where two or more digital data input signals are input into the conversion system, a separate sigma-delta modulator and phase-locked loop is required for each digital data input signal. The problem with this approach is that these additional elements require additional surface area on a chip and become increasingly expensive as the number of digital data input streams increases.

An alternative approach used in the prior art is to use a digital mixer with only one sigma-delta modulator and one clock. However, as will be discussed in greater detail below, this approach requires greater processing power, especially during sampling rate conversion where either the upsampling rate or downsampling rate become very high. Moreover, with the multiple digital input frequencies, a large bank of filters is necessary to accommodate the interpolation process. Once again, the problem with this approach includes not only additional hardware requirements, but also additional processing power for matching the appropriate upsampling and downsampling ratios for the filters to produce an input for a sigma-delta modulator.

Accordingly, it is desirable to provide a digital-to-analog conversion system that is able to process a single or multiple digital data input stream, regardless of the sampling frequency applied to each digital data input stream, using a minimal of hardware components.

SUMMARY OF THE INVENTION

The present invention is directed to a system and method that satisfies the need for the conversion of digital data signals and analog data signals through the use of minimal hardware components, system resources, and processor power. The system of the present invention comprises a signal input line, a reconstructor-resampler unit, a modulator, a digital-to-analog converter, and a signal output line. If there are more than one digital data signals for input into the system, the present invention also includes a combiner. The reconstructor-resampler is comprised of a sampling member and a polynomial interpolator member.

The signal input line couples the reconstructor-resampler and the reconstructor-sampler couples the modulator. The modulator couples the digital-to-analog converter that couples the signal output line. If the system accepts more than one digital data signal, the signal line input couples the respective reconstructor-resampler, for the respective digital data signal. Each reconstructor-resampler couples a combiner that combines the digital data signals. The combiner then couples the modulator, and the modulator couples the digital-to-analog converter that couples the signal output line. In addition, the modulator of the present invention operates at a fixed frequency set by a clocking mechanism, regardless of a sampling frequency of the digital data signals. The system of the present invention has the advantage of converting digital data signals to an analog data signal using fewer hardware components and, in turn, reduced chip surface area, less processing power, and few system resources because hardware and system redundancy is reduced. Therefore, the present invention increases the conversion system performance while reducing the costs associated with digital-to-analog conversion systems.

The method of the present invention comprises the steps of inputting a digital data signal, having a sampling frequency, reconstructing and resampling the digital data signal to generate a resampled data signal, performing noise-shaping on the resampled data signal to generate an x-bit data signal in a modulator that is operating at a fixed frequency regardless of the sampling rate of the digital data signal, converting the x-bit data signal into an analog data signal, and outputting the analog data signal. When there is an input of more than one digital data signals, the present invention includes the steps of inputting each digital data signal, each having a sampling frequency, on its own input line, reconstructing and resampling each digital data signal to generate a resampled data signal for each digital data signal, combining each resampled data signal to generate a combined data signal, performing noise-shaping on the combined data signal to generate an x-bit data signal in a modulator that is operating at a fixed frequency regardless of the sampling rates of the digital data signals, converting the x-bit data signal into an analog data signal, and outputting the analog data signal. The method of the claimed invention reduces the amount of processing power and system resources necessary for conversion of digital data signals to an analog data signal. Therefore, the method of the claimed invention significantly improves performance in a digital-to-analog conversion system.

The present invention may also be directed to an analog-to-digital conversion system and method, that includes the reconstructor-resampler unit and the modulator operating at a fixed frequency that is greater than an output sampling frequency. The system and method has similar benefits and advantages as the digital-to-analog conversion system.

These and other features, aspects, and advantages of the present invention will become better understood with regard to the following description, appended claims, and accompanying drawings.

DETAILED DESCRIPTION OF THE PREFERRED EMBODIMENT

Generally, the present invention relates to sigma-delta digital-to-analog converter systems that are designed to operate a sigma-delta modulator at a fixed clock rate regardless of a sampling frequency applied to a digital signal. The present invention is also designed to operate using substantially less processing power than prior art systems by using a reconstructor-resampler and using substantially fewer hardware components by using a single sigma-delta modulator that runs at a fixed clock regardless of the number of and the sampling frequencies of the digital signals input into the conversion system that are to be converted to an analog output signal.

Figure 1A:
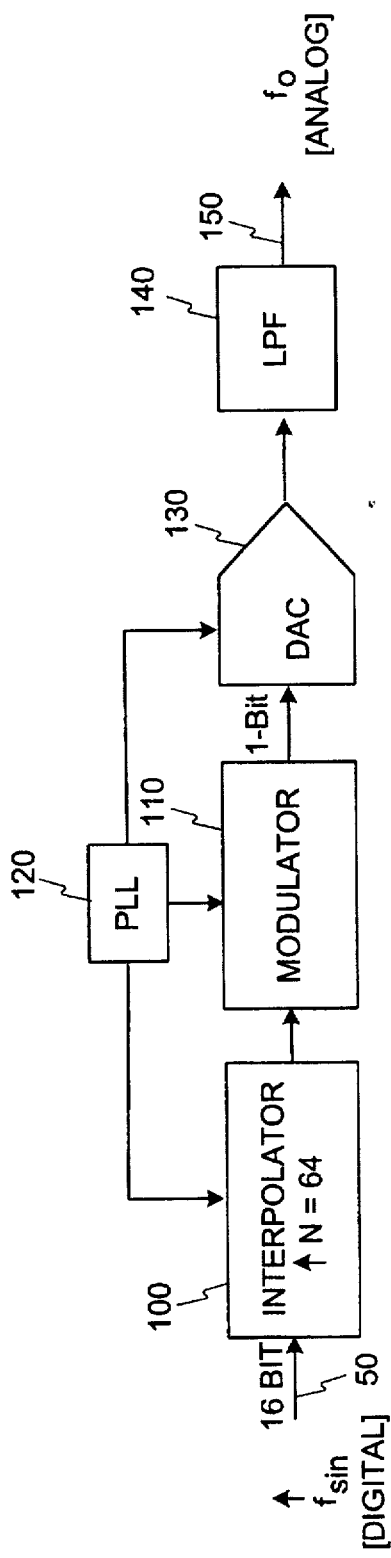
FIG. 1A is a block diagram of a first prior art sigma-delta digital-to-analog converter system for converting a digital input to an analog output using a high sampling frequency.

Referring now to FIG. 1A, a block diagram illustrates a prior art sigma-delta digital-to-analog conversion system. A prior art conversion system includes a signal line 50, an interpolator 100, a modulator 110, a digital-to-analog converter 130, a filter 140, an output signal line 150, and a phase-locked loop 120. Typically, a 16-bit digital data input stream or signal enters the system on the signal line 50.

Figure 1B:
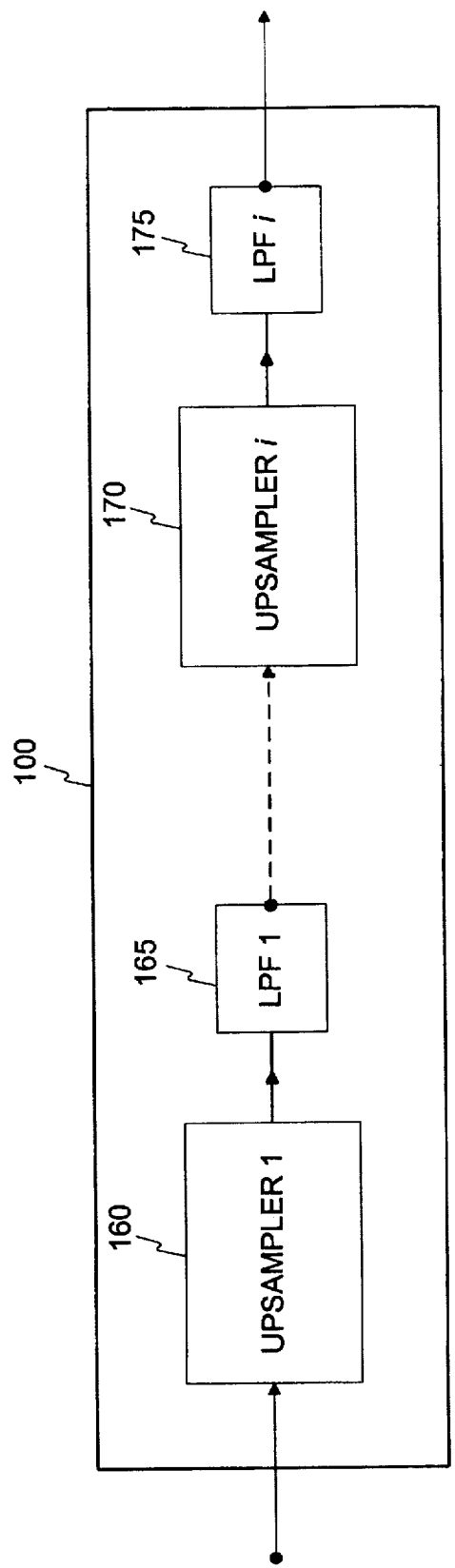
FIG. 1B is a block diagram of a prior art interpolator having a series of cascaded upsamplers, each followed by a low-pass filter.

The signal line 50 is coupled to the interpolator 100. The digital data input stream is sent on signal line 50 and through the interpolator 100 to be upsampled by a factor of N, where N, for example, may be 6. The interpolator 100, and subsequent interpolators, may be comprised of a single upsampler with a low-pass filter. However, the interpolator 100 typically is a cascaded series of upsamplers with associated low-pass filters. FIG. 1B illustrates a the cascades series of upsamplers with associated low-pass filters through upsamplers 1, i 160, 170 followed by associated low-pass filters 165, 175, as is conventional in the art. For example, the interpolator 100 that has an upsampling factor of 64, includes three upsamplers with an upsampling factor of 4, each upsampler followed by a low-pass filter.

The interpolator 100 upsamples the data signal to smooth it out using one of a variety of prior art methods. For example, in one method, the interpolator 100 takes two successive 16-bit digital data input streams and then adds them together before dividing the added data signals by two to find an average. The data signal is then smoothed by passing it through a low-pass filter in the interpolator 100 to filter out high frequency noise. In a second method the interpolator 100 upsamples a digital data input signal is by taking two successive 16-bit data input streams, or strings, and adding a 16-bit data stream of zeros between them. Yet, in a third method the interpolator 100 upsamples a data stream through a standard sample and hold where a previous data signal is simply repeated. The second and third methods of upsampling are more common because each requires less processing resources than the first method involving averaging. Once upsampled, the data signal passes through a low-pass filter in the interpolator 100, that smoothes out the signal by filtering out high frequency harmonics induced by the interpolation process.

The interpolator 100 is coupled to the modulator 110 so that from the interpolator 100 the data signal is fed to the modulator 110. Typically, the modulator 110 is a sigma-delta modulator. The modulator 110 is a feedback system that performs noise-shaping on the data input signal. The modulator 110 processes the data stream to generate a one-bit data stream output. The modulator 110 operates at a frequency equal to the sampling frequency of the digital input data stream times the interpolator 100 upsampling rate. A phase-locked loop 120 provides a clock source for synthesizing the required frequency for the modulator 110, the interpolator 100, and the digital-to-analog converter 130. If the sampling frequency of the digital input data stream changes, the phase-locked loop 120 must be adjusted accordingly to synthesize the frequency necessary to drive the modulator 110.

The one-bit data stream output from the modulator 110 is next fed into the digital-to-analog converter 130 that is operating at the frequency set by the phase-locked loop 120. The digital-to-analog converter 130 converts the one-bit digital data stream to a corresponding set of ones and zeros that represent an analog data stream. The analog data stream is then passed through a low-pass filter 140, which filters out high frequency noise to produce the analog data output stream along the output line 150 for driving a particular device, such as a sound speaker or amplifier.

Figure 2:
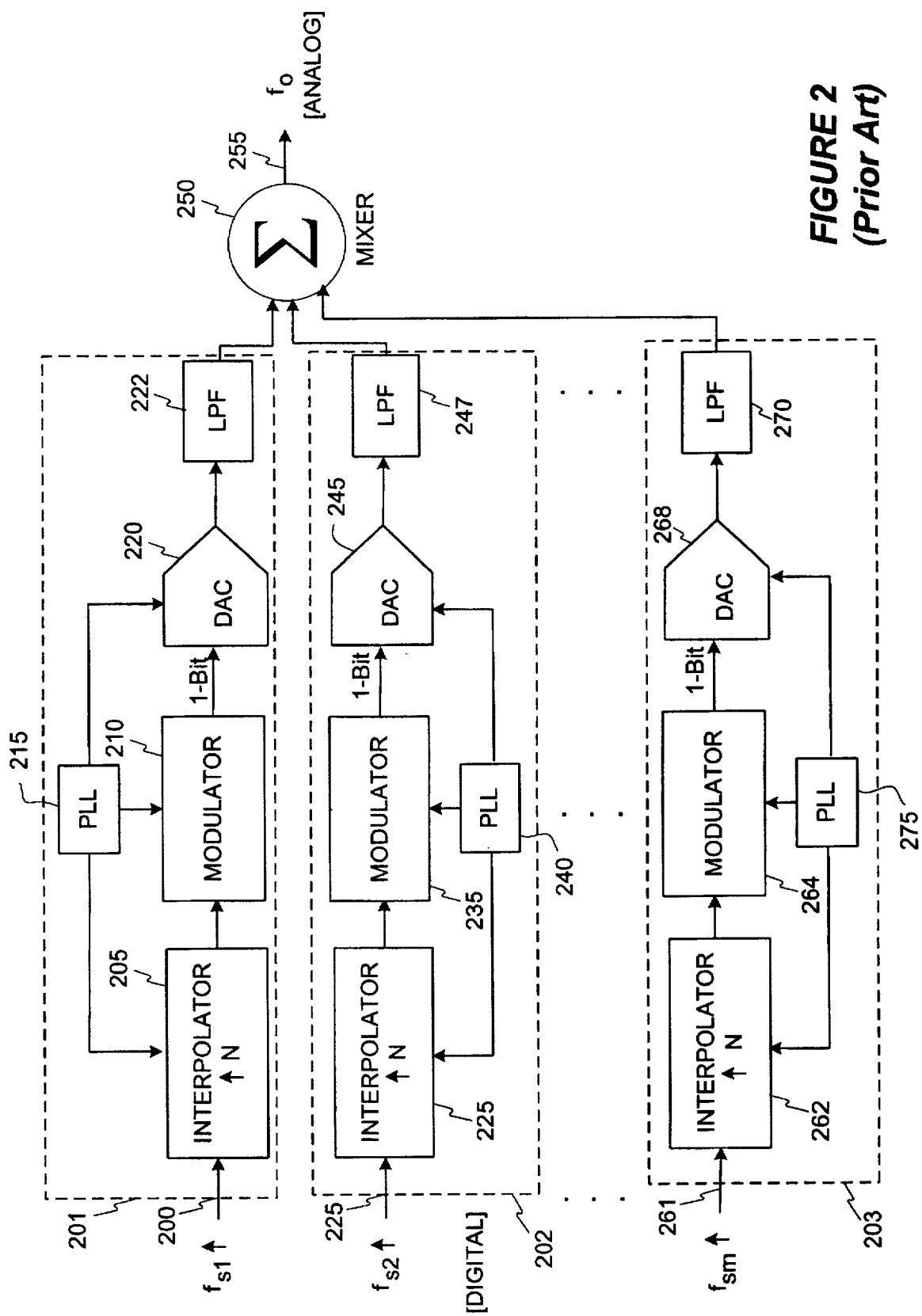
FIG. 2 is a block diagram of a second prior art sigma-delta digital-to-analog converter system where more than one digital inputs, each using a different sampling frequency, must be converted to an analog output using an analog mixer.
Figure 3:
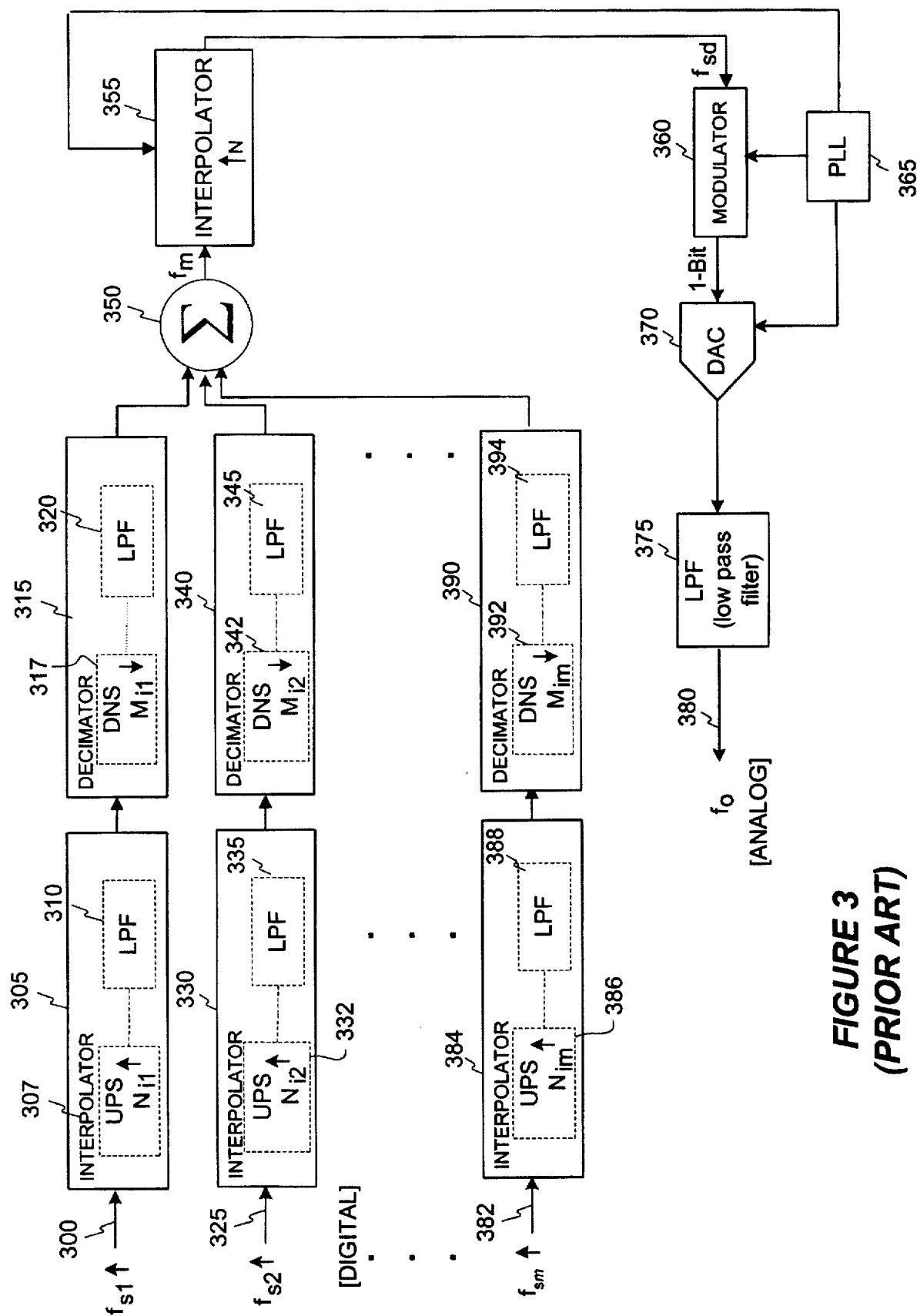
FIG. 3 is a block diagram of a prior art sigma-delta digital-to-analog converter system where more than one digital inputs must be converted to an analog output using a digital mixer.

FIGS. 2 and 3 illustrate block diagrams of prior art sigma-delta digital-to-analog converter systems where more than one digital data input streams is converted to an analog data output stream.

First, FIG. 2 illustrates a prior art conversion system that includes a sub-conversion system 201, 202, 203 for each digital data input stream. Each sub-conversion system 201, 202, 203 includes a signal line 200, 225, 261, an interpolator 205, 230, 262, a modulator 210, 235, 264, digital-to-analog converter 220, 245, 268, and a low-pass filter 222, 247, 270. The conversion system also includes an analog mixer 250 and an output line 255. In each sub-conversion system, the signal line 200, 225, 261 is coupled to the interpolator 205, 230, 262 that, in turn, is coupled to the respective modulator 210, 235, 264. The modulator 210, 235, 264 is coupled to the respective digital-to-analog converter 220, 245, 268 and associated or coupled low-pass filter 222, 247, 270. Each sub-conversion system is then coupled to the analog mixer 250 and the output line 255 of the conversion system. Each sub-conversion system also includes a phase-locked loop 215, 240, 275 to clock the respective sub-conversion system.

Generally, in the analog mixer conversion system implementation each digital data input stream is combined and converted to an analog data output stream through the use of the analog mixer 250. In this implementation, each digital data input stream represents a respective audio stream and is first converted to an analog signal before being added together through the analog mixer 250. For example, the first digital data input stream enters on the signal line 200 and is upsampled by a factor of N through the interpolator 205. The interpolated first data signal is then fed to a sigma-delta modulator 210 for noise-shaping to produce a one-bit data stream output. The modulator 210 operates at a frequency set by a phase-locked loop 215. The frequency is a multiple of the input sampling frequency times the interpolator 205 upsampling rate, N. The phase-locked loop 215 is dedicated for only the digital data input stream entered on the particular signal line 200 circuit. The one-bit output from the modulator 210 is then fed through a one-bit digital-to-analog converter 220 that is also operating at a clock rate set by the phase-locked loop 215 and that produces an analog stream that is sent to the analog mixer 250.

Similarly, the second through mth digital data input streams entering on their respective signal lines 225, 260 are sent through their respective sub-conversion systems 202, 203. Each digital data input stream enters the signal line 225, 261 that is coupled to the interpolator 230, 262 for upsampling the digital data signal. The upsampled data signal is sent from the interpolator to the modulator 235, 264 where the data signal is converted to a one-bit data signal that is sent to a one-bit digital-to-analog converter 245, 268. The digital-to-analog converter 245, 268 produces an analog stream that is sent to the analog mixer 250 for mixing with other analog streams to ultimately produce an analog data output stream at the output line 255. Both the modulator 235, 264 and the digital-to-analog converter 245, 268 are clocked by a clock signal originating from their own phase-locked loop 240, 275 and is a multiple of the digital data input stream sampling frequency times the upsampling factor, N, of the interpolator 230, 262.

The problem with the analog mixer implementation is that it requires a larger chip area to accommodate the required sub-conversion system circuitry for each digital data input stream. In addition, the multiple clocks on a chip, necessary for each sub-conversion system circuit, generates a large amount of noise on each chip that could affect the performance of various analog components on the chip. The additional hardware also requires a larger chip surface area. Moreover, the additional hardware associated with each sub-conversion system requires additional power to be supplied to drive each sub-conversion system.

Next, FIG. 3 illustrates a prior art conversion system that includes for each digital data input stream, a signal line 300, 325, 382, an interpolator 305, 330, 384, and a decimator 315, 340, 390. The prior art conversion system also includes a digital mixer 350, an interpolator 355, a modulator 360, a digital-to-analog converter 370, a phase-locked loop 365, a low-pass filter 375, and an output line 380. Each signal line 300, 325, 382 is coupled to the respective interpolator 305, 330, 384. Each interpolator is coupled to the respective decimator 315, 340, 390. Each decimator is coupled to digital mixer 350. The digital mixer 350 is coupled to the interpolator 355, that in turn is coupled to the modulator 360. The modulator 360 is coupled to the digital-to-analog converter 370 that is associated or coupled with the low-pass filter 375. The digital-to-analog converter 370 and associated low-pass filter 375 is coupled to the output line 380. The phase-locked loop 365 is coupled to the system components, including the interpolator 355, the modulator 360, and the digital-to-analog converter 370 to clock these devices.

Generally, in the prior art digital mixer conversion implementation, a first digital data input stream, a second digital data input stream, up through a mth digital data input stream, are mixed in a digital mixer 350 to convert the digital data signals into an analog data output stream. Unlike the prior art analog mixer implementation, the prior art digital mixer implementation requires only a single sigma-delta modulator 360 because it uses a pure digital sampling rate conversion process. However, a pure digital sampling rate conversion requires a large amount of processor power and system resources.

In a prior art digital mixer implementation, each digital data input stream must be converted to the same sampling frequency before being mixed in a digital mixer. The first digital data input stream 300 is upsampled $N_{i1}$ times in an interpolator 305 that includes an upsampler 307 and a low-pass filter 310, used to avoid any aliasing. The filtered upsampled data stream is then downsampled $M_{i1}$ times in a decimator 315 that includes a downsampler 317 and a low-pass filter 320, again used to avoid any aliasing. Similar to the interpolators, the decimator 315, and subsequent decimators, may be a single downsampler with a low pass filter, but more typically is a cascaded series of downsamplers with associated low-pass filter.

The data stream that emerges from the decimator is then sent to the digital mixer 350. Similarly, the second digital data input stream through the mth digital data input stream are also upsampled $N_{i2}$ and $N_{im}$ times, respectively in the interpolator 330, 384 that includes an upsampler 332, 386 and a low-pass filter 335, 388 which is used to avoid aliasing. The filtered upsampled data streams are then decimated $M_{i2}$, $M_{im}$ times, respectively in a decimator 340, 390 that includes a downsampler 342, 392 and another low-pass filter 345, 394 once more to avoid any aliasing. Each data stream is then sent to the digital mixer 350 where it is combined with other digital data input streams.

The data stream from the digital mixer 350 is then fed to an interpolator 355 where it is upsampled N times. From the interpolator 355 the combined data stream is sent to a sigma-delta modulator 360 for noise-shaping. The sigma-delta modulator 350 produces an output of a one-bit data stream. The one-bit data stream is fed into a digital-to-analog converter 370 to convert the digital data stream to an analog data stream. Both the sigma-delta modulator 360 and the digital-to-analog converter 370 use a single phase-lock loop 365 for the clock rate, of $f_{sd}$. The analog data stream is passed through a low-pass filter to produce an analog data output stream 380.

The values for $N_x$ and $M_x$,where x is a particular digital data stream, are calculated based on the known sampling frequency of each data stream input, $f_{sx}$, and the known sampling frequency, $f_m$, for the digital mixer 350. For each data stream, $$f_{sx}*(N_x/M_x)=f_m, \text{ so that the ratio of } (N_x/M_x)=(f_m/f_{sx}).$$

In the prior art digital mixer implementation, if the ratio between the input sampling rate and the output sampling rate, $(N_x/M_x)$, is a rotational number the rate conversion is achieved by upsampling each digital data input stream $N_x$ times (interpolation by $N_x$), then downsampling the data stream $M_x$ times (decimation by $M_x$). A problem associated with this implementation is that because $N_x$ and $M_x$ must be whole numbers, when $N_x$ or $M_x$ become very large, the upsampling process and the downsampling process become very tedious and the steps necessary for the conversion system become very numerous.

Another problem with the prior art digital mixer implementation emerges when multiple digital data input streams are present. In the prior art digital mixer implementation, a large low-pass filter bank is necessary if both $N_x$ and $M_x$ are not small integers or are not rational numbers. For example, if the ratio between input and output rates is not a rational number, only very large $N_x$ and $M_x$ could be picked to approximate the exact ratio necessary for the digital mixer. In such cases, the order of the low-pass filter needed is very large and requires the large low-pass filter bank because the low-pass filter coefficients are a function of $N_x$ and $M_x$. Furthermore, the processing power necessary where $N_x$ and $M_x$ are large is greater for each digital data input stream.

Figure 4:
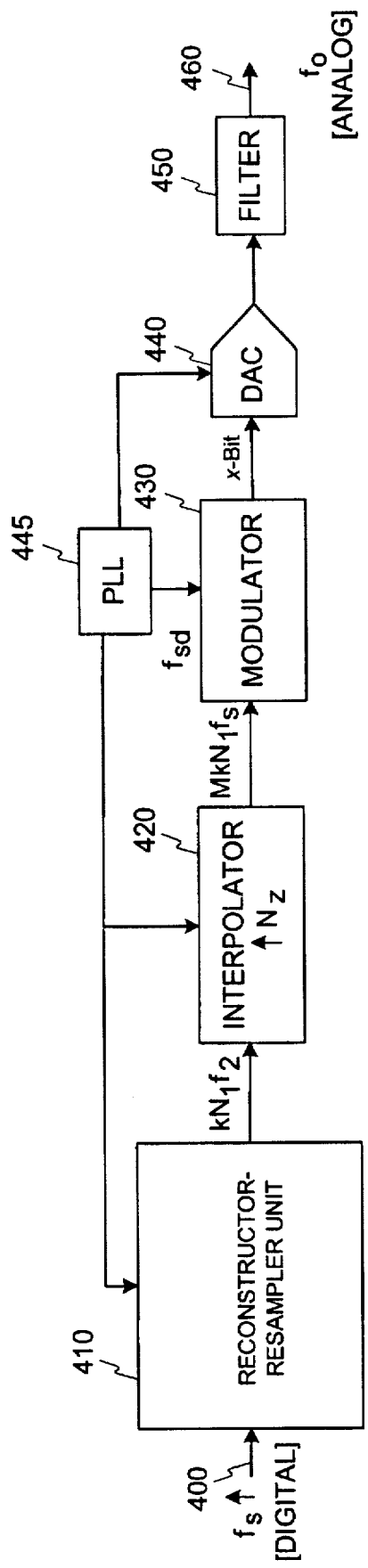
FIG. 4 is block diagram of a first embodiment of a sigma-delta digital-to-analog converter system of the present invention using reconstructor-resampler and a modulator having a fixed frequency regardless of the sampling frequency of the data input.

Turning now to FIG. 4, a block diagram illustrates a first embodiment of the present invention. The first embodiment includes a signal input line 400, a reconstructor-resampler unit 410, an interpolator 420, a modulator 430, a digital-to-analog converter 440, a phase-locked loop 445, a low-pass filter 450, and a signal output line 460. The signal input line 400 is coupled to an input of the reconstructor-sampler unit 410. An output of the reconstructor-resampler unit 410 is coupled to an input of the interpolator 420. An output of the interpolator 420 is coupled to an input of the modulator 430. An output of the modulator 430 is coupled to an input of the digital-to-analog converter 440. The digital-to-analog converter is associated with the low-pass filter 450 and an output from the digital-to-analog converter couples to an input of the low-pass filter 450. The output of the low-pass filter 450 may couple to or may serve as the signal output line 460. The phase-locked loop 445, or other clock source or mechanism, is coupled to a respective clock input of the reconstructor-sampler unit 410, the interpolator 420, the modulator 430, and the digital-to-analog converter 440.

In the first embodiment, the sampling rate conversion is accomplished through a combination of digital upsampling with classic curve-fitting accomplished through polynomial interpolation. In the first embodiment of the present invention, the sampling rate conversion involves a waveform reconstruction and resampling and is accomplished in a conversion system having the reconstructor-resampler unit 410. Moreover, the present invention requires only a single system clock to drive the reconstructor-resampler 410, the interpolator 420, the modulator 430 and the digital-to-analog converter 440. The phase-locked loop 445, with a fixed clock rate drives the present invention conversion system regardless of the sampling rate of a digital data input stream entering the conversion system.

In the present invention, the digital data input stream, having a sampling frequency, $f_r$, is received through the signal input line 400. The input stream is fed into the input of the reconstructor-resampler 410 to produce, at the output of the reconstructor-resampler 410, a digital data stream that has an upsampled frequency, $kN_1f_r$. The upsampled frequency is a multiple of the reconstructor-resampler 410 components, as discussed below. The upsampled frequency from the reconstructor-sampler 410 is fed into the interpolator 420 and further upsampled $N_2$ times to produce at the interpolator 420 output a digital data stream with a high sampling frequency of $N_2kN_1f_r$. The resulting very high sampling frequency digital data stream is then fed to a modulator 420, such as a sigma-delta modulator, that is operating at a fixed clock rate of $f_{sd}$, driven by the phase-locked loop 445 circuit. The clock rate $f_{sd}$ is substantially equivalent to the high sampling frequency of the digital data stream entering the modulator 430, so that the frequency of the modulator, $f_{sd}$ is substantially equivalent to $N_2kN_1f_r$.

The modulator 430 performs noise-shaping on the digital data stream to produce an x-bit digital data stream, where x typically is one-bit. The x-bit digital data stream is then sent to a x-bit digital-to-analog converter 440 where the x-bit digital data stream is converted to an analog data stream. The analog data stream is then sent to a low-pass filter to filter out, either reducing or eliminating, unnecessary noise to produce an analog data output stream at the output signal line 460 that is suitable for driving a device such as a stereo speaker or an amplifier.

Figure 5:
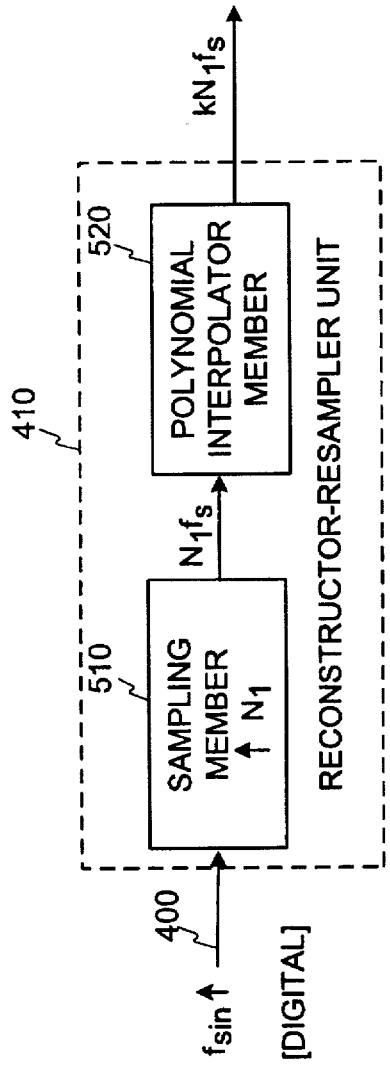
FIG. 5 is a block diagram of the reconstructor-resampler used in the system of FIG. 4.

Referring to FIG. 5, a block diagram illustrates components of the reconstructor-resampler unit 410. The reconstructor-resampler unit 410 includes a sampling member 510 and a nth order polynomial interpolator member 520. The signal input line 400 is coupled to an input of the sampling member 510. An output of the sampling member 510 is coupled to an input of the polynomial interpolator member 520. The output of the polynomial interpolator member 520 serves as the output of the reconstructor-resampler unit 410.

In the present invention, the reconstructor-resampler unit 410 is used for a sampling rate conversion process in which a discrete sequence or digital waveform is reconstructed into an analog waveform and then resampled at a desired sampling rate. This sampling rate conversion in the reconstructor-resampler unit 410 is accomplished through an interpolation and oversampling process using polynomial interpolation. The digital data input stream, having a sampling frequency, $f_s$, enters the reconstructor-resampler unit 410 on the signal input line 400 and is first upsampled $N_1$ times in the sampling member 510. In this embodiment of the present invention, $N_1$ is calculated as described below. The upsampled digital data stream from the sampling member 510, having a sampling frequency of $N_1 f_s$, is then fed into the nth-order polynomial interpolator member 520 for curve-fitting. The resulting digital data stream, having a sampling frequency of $kN_1 f_s$, is output from polynomial interpolator member 520 and sent to the interpolator 420 of the present invention conversion system.

Figure 6:
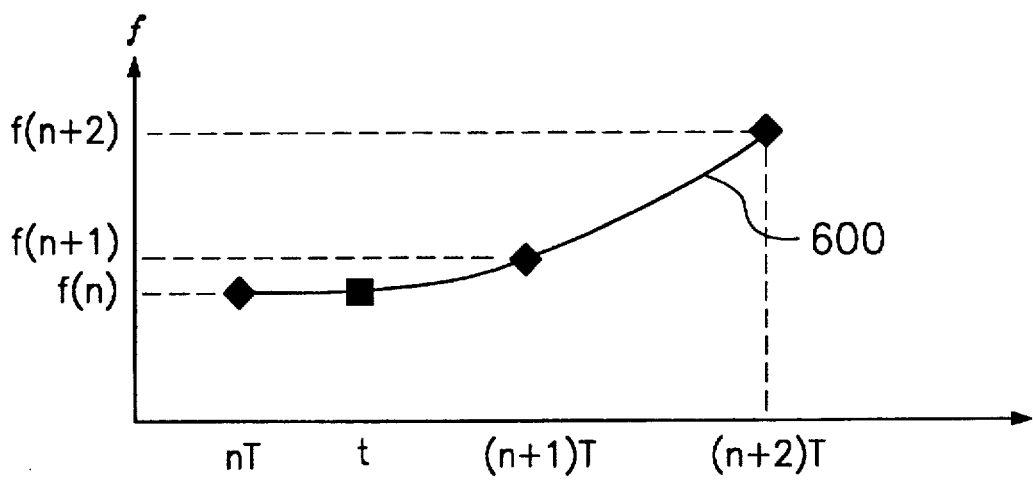
FIG. 6 is a graphical representation of second-order polynomial interpolation process used by the reconstructor-resampler of FIG. 5.

Looking now to FIG. 6, a graph represents one embodiment of the curve-fitting operation in the nth-order polynomial interpolator member 520 of the reconstructor-resampler unit 410 that is used for the sampling rate conversion. The sampling rate conversion of the present invention is a waveform reconstruction and resampling process that is accomplished through interpolation and oversampling using polynomial interpolation.

An input sequence f(n) is a discrete or digital representation of an analog waveform f(t), which is periodically sampled with a sampling period T so that f(nT) equals f(n). To reconstruct a waveform f(t) 600 a polynomial-interpolation method, such as a Newton-Gregory Forward (NGF) interpolation method is applied in the process. In the NGF interpolation method, the waveform f(t) 600 for t between nT and (n+1)T is approximated by a second order polynomial $f(t)=f(n)+at+bt^2$, with the boundary conditions $f((n+1)T)=f(n+1)$, and $f((n+2)T)=f(n+2)$. If the same reconstructed function f(t) is applied to t between (n+1)T and (n+2)T, this method is known as a Newton-Gregory Backward (NGB) method. These calculations are used to determine the upsampling rate, $N_1$, of the sampling member 510 in the reconstructor-resampler unit 410. Calculating $N_1$ using these calculations results in a better curve fit for the signal entering the polynomial interpolator member 520.

The error from applying the NGF method can be expressed as:

$$\sigma(s) = s(s-1)(s-2)T^3 f'''(t_x)/6$$

where $s=(t-nT)/T$; $0 \le s < 1$; $nT < t_x < (n+1)T$.

The upper bound for the error may be estimated. Assuming the input is band limited with maximum input frequency $\omega$, $\omega$ is related to the input sampling frequency $f_s=1/T$ by the following:

$$\omega = \pi/T/OS$$

where OS is the over-sampling ratio. If OS=1, the sequence is sampled at the Nyquist sampling rate.

The maximum error can be estimated by the signal with the highest frequency $\omega$, where $f(t)=\sin(\omega t)$ or $f'''(t)=\omega^{-3}\sin(\omega t)$. By approximating the sine term as its root mean square ("rms") value of $1/\sqrt{2}$, the error is $$\sigma(s) = (s(s-1)(s-2)(\omega)^3)/(6\sqrt{2}) = (s(s-1)(s-2)(\pi/OS)^3)/(6\sqrt{2})$$

The root mean square error can be obtained by integrating $\sigma(s)^2$ from $0 < s < 1$. Thus, $$\sigma = rms\{\sigma(s)\} = 0.03(\pi/OS)^3$$

The larger OS is, the smaller the maximum error. Therefore, it is desirable to upsample the digital data input stream first before undertaking the curve-fitting process. One way the upsampling is achieved is by interpolation, including digital interpolation. The upsampling ratio is estimated by the accuracy requirement. For example, in a typical audio application the maximum error allowed is ≈0.01% (or ≈80 dB). The OS in such cases would need to be 16 or greater.

As applied to the present invention, the sampling rate conversion process takes a digital data input stream sequence x(n), with a period T, and first upsamples the input sequence at a predetermined oversampling rate, OS. The resulting new sequence f(n), with a new period T/OS=T', is then used for curve-fitting, using polynomial interpolation, to produce an output sequence y(n). The output sequence y(n), with a new period T', is obtained through a series of processing steps described below.

First, t=nT" is calculated. This requires a clock, typically the same system clock that drives the modulator 430, having a period T". Second, the parameter s and the integer m must be determined, such that $mT' < t < (m+1)T'$. This is usually accomplished through the use of an internal phase counter which stores the ratio $\alpha = T''/T'$ initially. For each increment in n, the phase counters increment by an amount $\alpha$. Here, the integer parts of the phase counter equal m and the fractional parts equal s. Third, y(n) is approximated by f(t), which is obtained by curve-fitting a sub-sequence {f(m), f(m+1), f(m+2)} with the parameters s and m described above.

Next, for each (m, s), the sub-sequence {f(m), f(m+1), f(m+2)} needs to be present for interpolation. A control circuit, e.g., first-in first-out (FIFO), is used to maintain the proper input data flow. Finally, if the input sampling rate changes, only the $\alpha$ factor for the phase counter needs to change. The phase counter and the FIFO control circuit control the data flow accordingly without the need for a phase-locked loop. After undergoing sampling rate conversion using the interpolation and polynomial interpolation processes in the reconstructor-resampler 410, the digital data input stream frequency is now converted to have a substantially fixed sampling rate.

In an alternative embodiment of the present invention, other polynomial interpolation orders and methods may also be used in addition to a second-order NGF. Moreover, depending on the order of the polynomial chosen, the upsampling ratio preceding the curve-fitting process may be increased or decreased. For example, if a fourth-order polynomial interpolation is used, the digital data input stream sequence may be upsampled eight times.

Figure 7A:
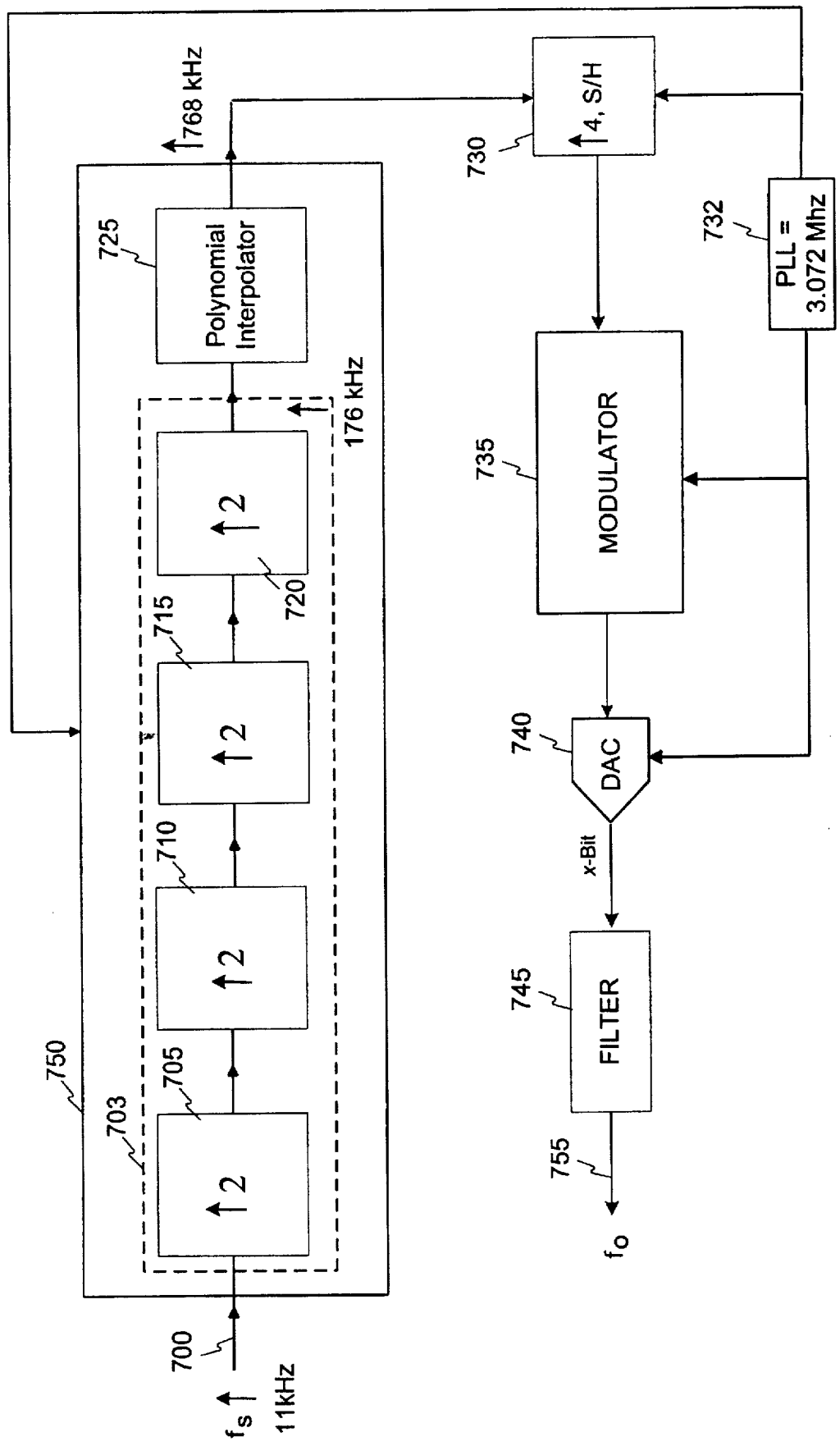
FIG. 7A is a block diagram of a second embodiment of a converter system of the present invention.

FIG. 7A is a block diagram illustrating a second embodiment of the present invention conversion system. The second embodiment includes a signal input line 700, a reconstructor-resampler unit 750, a sample and hold circuit 730, a modulator 735, a digital-to-analog converter 740, a low-pass filter 745, a phase-locked loop 732, and a signal output line 755. The reconstructor-resampler 750 comprises an sampling member 703 and a polynomial interpolator member 725. The sampling member 703 comprises a series of cascaded sub-sampling members 705, 710, 715, and 720.

The signal input line 700 is coupled to the sampling member 703 at the input of the first sub-upsampler 705. An output of the first sub-sampling member 703 is coupled to an input of the second sub-sampling member 710 and an output of the second sub-sampling member 710 is coupled to an input of the third sub-sampling member 715. An output of the third sub-sampling member 715 is coupled to an input of the fourth sub-sampling member 720. An output of the fourth sub-sampling member 720 serves as an output for the sampling member 703 and is coupled to an input of the polynomial interpolator member 725 input. An output of the polynomial interpolator member 725 serves as an output of the reconstructor-resampler unit 750 and is coupled to an input of the sample and hold circuit 730. An output of the sample and hold circuit 730 is coupled to an input of the modulator 735. An output of the modulator 735 is coupled to an input of the digital-to-analog converter 740. The digital-to-analog converter is associated with a low-pass filter 745 and an output of the digital-to-analog converter 740 is coupled to an input of the low-pass filter 745. The low-pass filter 745 may also be integrated with the digital-to-analog converter 740. An output of the low-pass filter 745 is coupled to or serves as the signal output line 755. The phase-locked loop 732 provides the clock signal for a respective clock input of the reconstructor-resampler unit 750, the sample and hold circuit 730, the modulator 735 and the digital-to-analog converter 740.

A digital data input stream is received at the signal input line 700. In this embodiment, the digital data input stream has a sampling frequency of 11 kHz and is upsampled 16 times through the series of sub-sampling members 705, 710, 715, 720 of the sampling member 703 in the reconstructor-resampler unit 750. The sub-sampling members 705, 710, 715, 720 each operate to upsample the data stream two times and then filter the data stream through its own corresponding half-band filter. The data stream has a frequency of 176 kHz (11 kHz*16 (upsampling factor)) after passing through the last sub-sampling member 720 and the corresponding half-band filter. The data stream is then sent to a second-order polynomial interpolator member 725. The polynomial interpolator member 725 generates a data stream having a 768 kHz upsampled frequency. Moreover, because a 768 kHz frequency is desired, the value of k in $kN_1f_s$ is calculated to be 4.36363636. A frequency of 768 kHz is desired because the sample and hold circuit 730 will further upsample the signal 4 times so that the sampling frequency input into the modulator 735 will be 3.072 MHz, the rate of the clock signal clocking the modulator 735.

Once the digital data stream leaves the reconstructor-resampler unit 750 it is fed into the sample and hold circuit 730. The sample and hold circuit 730 upsamples the digital data stream four more times using a sample-and-hold process. The upsampled digital data stream, that now has a sampling frequency of 3.072 MHz, is fed into a fourth-order sigma-delta modulator 735 that is also operating at a frequency of 3.072 MHz. The modulator 735 performs a noise-shaping operation on the digital data stream and generates a one-bit data stream. The one-bit data stream is fed into a digital-to-analog converter 740 where an analog data stream is produced. The analog data stream is sent to a low-pass filter 745 to filter out the unnecessary noise and ultimately produce an analog data output stream or signal at the signal output line 755.

Figure 7B:
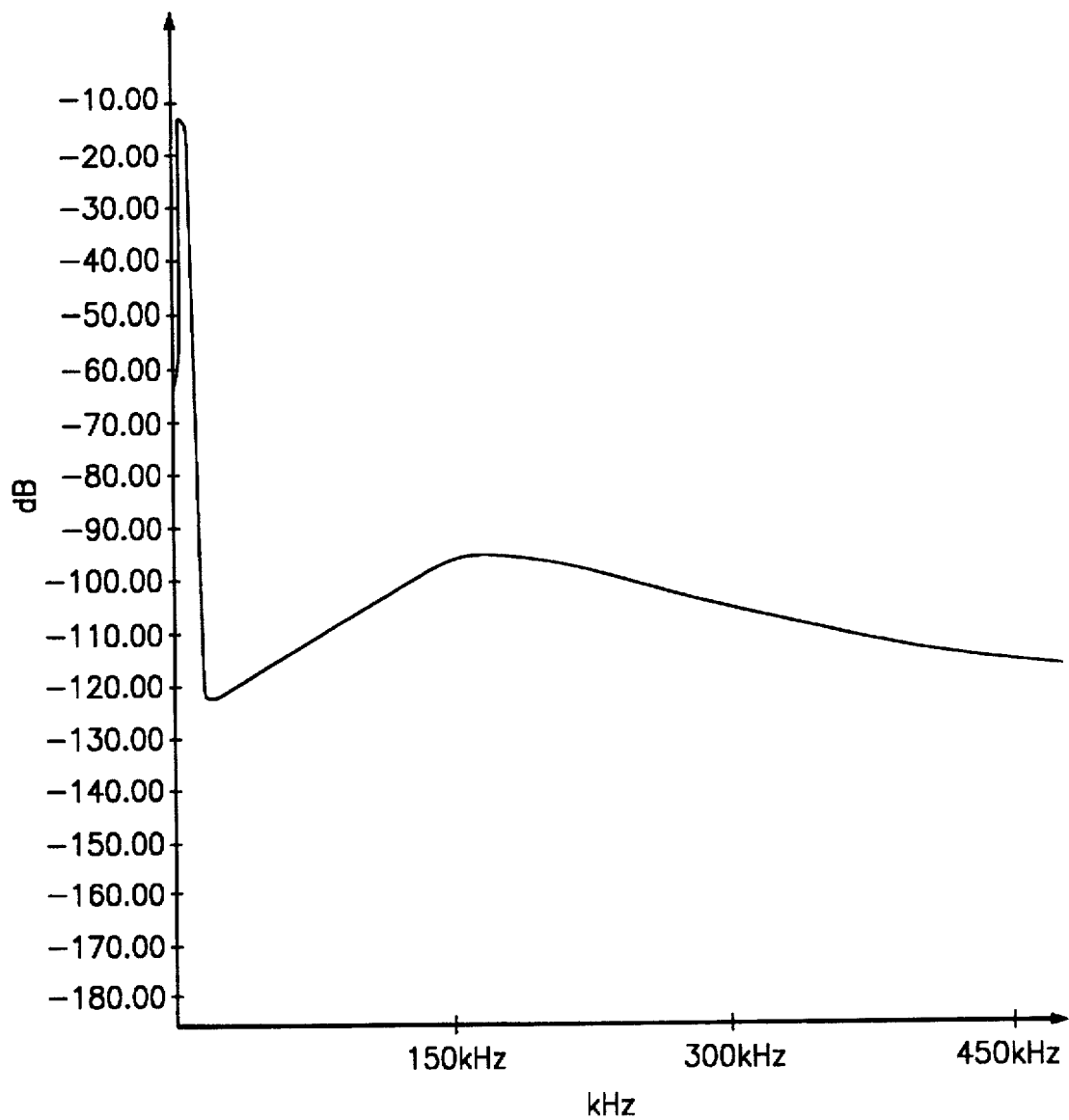
FIG. 7B is a graphical representation of the analog data output stream produced using the second embodiment of the digital-to-analog converter system of the present invention.

FIG. 7B is a graphical illustration of an analog data output stream using the second embodiment of the present invention shown in FIG. 7A. The signal to noise ratio is shown to be better than 80 dB.

Figure 8A:
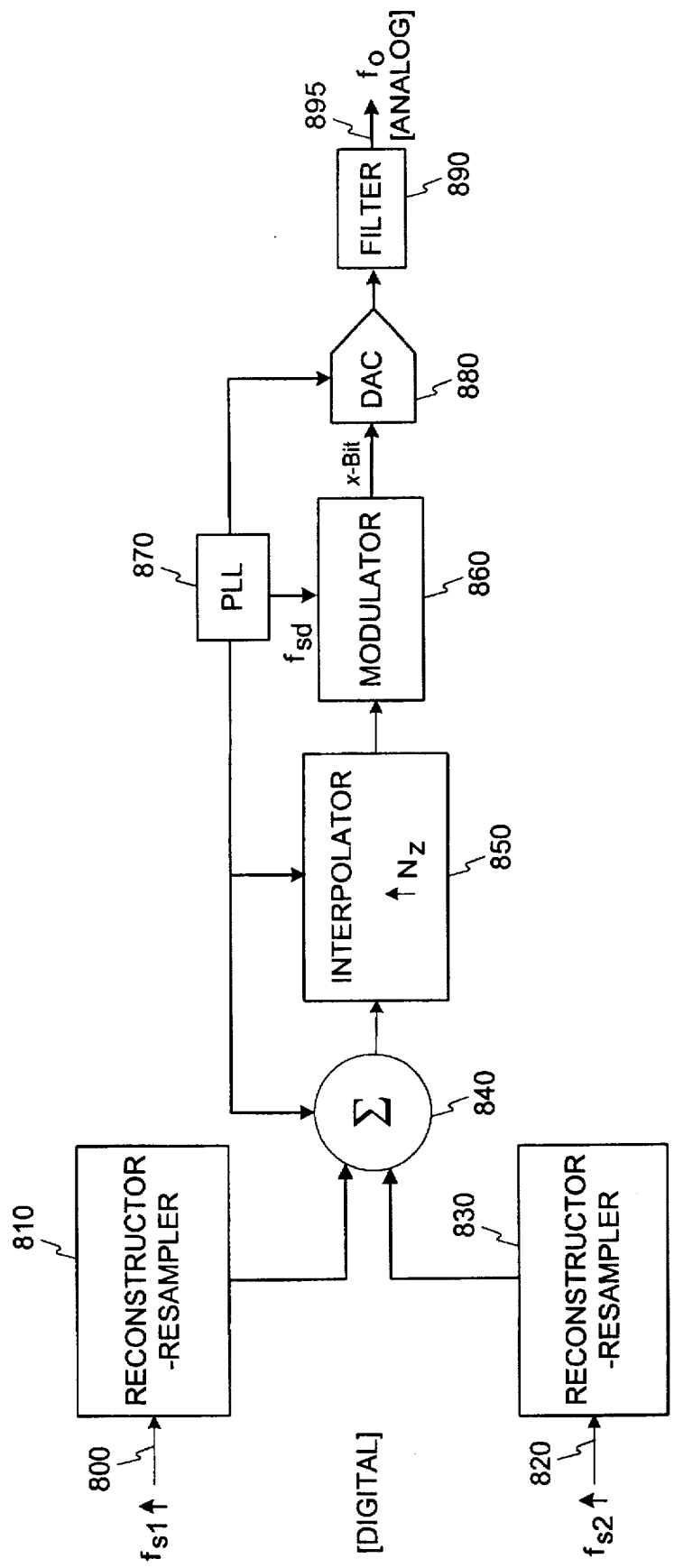
FIG. 8A is a block diagram of a third embodiment of a converter system of the present invention where two digital inputs are converted to an analog output.

Referring now to FIG. 8A, a block diagram illustrates a third embodiment of the present invention conversion system where there is more than one digital data input stream or signal and an analog data output stream or signal. The third embodiment includes a first signal input line 800, a second signal input line 820, a first reconstructor-resampler unit 810, a second reconstructor-resampler unit 830, a mixer, or digital combiner, 840, an interpolator 850, a modulator 860, a digital-to-analog converter 880, a low-pass filter 890, a phase-locked loop 870, and a signal output line 895.

The first signal input line 800 is coupled to an input of the reconstructor-sampler unit 810 and an output of the first reconstructor-resampler unit 810 is coupled to an input of the combiner 840. Similarly, the second signal input line 820 is coupled to an input of the second reconstructor-resampler unit 830 and an output of the second reconstructor-resampler unit 830 is coupled to an input of the combiner 840. An output of the combiner 840 is coupled to an input of the interpolator 850 and an output of the interpolator 850 is coupled to an input of the modulator 860. An output of the modulator 860 is coupled to an input of the digital-to-analog converter 880. An output of the digital-to-analog converter 880 is coupled to an input of the low-pass filter 890 and an output of the low-pass filter 890 is coupled to or serves as the signal output line 895. The low pass filter 890 may be integrated with the digital-to-analog converter 880. In addition, the conversion system is clocked by the phase-locked loop 870 that includes operating the modulator 860 at a predetermined, or fixed, frequency of $f_{sd}$.

A first digital data input stream, having a sampling frequency, $f_{s1}$, enters the system through the first signal input line 800. The digital data signal is fed into the input of the first reconstructor-resampler unit 810. The first reconstructor-resampler unit 810 has a sampling member, to upsample the first digital data input stream $N_1$ times, and a polynomial interpolator member, to further sample the first digital data input stream by a factor of k, creating a sampling rate conversion stream having a frequency of $kN_1f_{s1}$.

Similarly, a second digital data input signal, having a sampling frequency, $f_{s2}$, enters the system through the second signal input line 820. The digital data signal is fed into the input of the second reconstructor-resampler unit 830. The second reconstructor-resampler unit 830 also has a sampling member, to upsample the second digital data input stream $N_2$ times, and a polynomial interpolator member, to further sample the second digital data input stream by a factor of k, creating a sampling rate conversion stream having a frequency of $kN_2f_{s2}$.

Once the digital data streams work through the first reconstructor-resampler unit 810, and second reconstructor-resampler unit 830, respectively, the digital data input stream frequencies are converted to fixed frequencies. The data streams $kN_1f_{s1}$ and $kN_2f_{s2}$ are then forwarded to the digital combiner 840, operating at a frequency of $f_{sm}$, where they are combined together to form a combined data stream or signal having a sampling frequency of $kNf_s$ that is equal to a sampling frequency of $f_{sm}$. The digital combiner 840 is set to accept and generate the sampling frequency of $f_{sm}$. The combined data stream, now having an upsampled frequency $f_{sm}=kNf_s$, is then sent to the interpolator 850 where it is further upsampled $N_z$ times. The data stream from the interpolator 850 has a very high sampling frequency of $N_zkNf_s=N_zf_{sm}$ and is fed into the input of the modulator 860 that is operating a fixed frequency of $f_{sd}=N_zf_{sm}$, driven by a phase-locked loop 880. Due to operating the modulator 860 at the fixed frequency, the digital data signal input into the modulator 860 must have a substantially fixed frequency that is $f_{sd}=N_z*f_{sm}$. Moreover, because the modulator 860 operates at the fixed frequency and the sampling frequency for the digital combiner 840 is known, the values of $N_x$, and $N_z$ and may be calculated for the first and second reconstructor-resampler units 800, 820, and the interpolator 850, respectively.

The modulator 860 generates a x-bit data stream at its output. In this embodiment, the x-bit data stream is a one-bit data stream. The x-bit data stream is then fed into an x-bit digital-to-analog converter 880 that converts the digital x-bit data stream into an analog representation. The analog data stream is sent through a low-pass filter 890 that filters out unnecessary noise and sends out an analog data output signal 895 suitable to drive a device, such as a stereo speaker or an amplifier.

The advantage of this embodiment of the present invention, is that fewer hardware components and less chip surface area is required because the first and the second digital data input streams do need not be converted to an analog data signal before being combined as would be necessary in the prior art analog mixing implementation. Also, the present invention does not require expensive and complex circuitry or greater processing power or system resources before combining the digital data signals as would be necessary with the prior art digital mixing implementation. Moreover, if more than two digital data signals are present, the present invention has the advantage of using a reconstructor-resampler for each digital data signal, to synthesize the data signals before passing them through a digital combiner to combine them.

To illustrate how the system of FIG. 8A operates, consider the first digital input data stream having a sampling frequency of $f_{s1}=8$ kHz and the second digital input data stream having a sampling frequency of $f_{s2}=44$ kHz entered into the conversion system through the signal line inputs 800, 820 respectively. The modulator 860 operates at a frequency of 3.072 MHz, as set by the phase-lock loop 870. In addition, the digital combiner 840 is set for accepting data streams having a sampling frequency of 768 kHz. In the first reconstructor-resampler unit 810 and the second reconstructor-resampler unit 830, $N_1$ and $N_2$ are both set to upsample 16 times. Therefore, knowing $f_{s1}$, $f_{s2}$, $N_1$, $N_2$ and the data stream sampling frequency needed for the digital combiner 840, the values of $k_1$ and $k_2$ from the polynomial interpolator member of the first reconstructor-resampler unit 810 and second reconstructor-resampler unit 830 may be solved for using the following equations:

$f_{sd}=k_1 N_1 f_{s1}$ and $f_{sd}=k_2 N_2 f_{s2}$; so that $k_1=N_1 f_{s1}/f_{sm}$ thus, $k_1=(16*8$ kHz$)/768$ kHz$=0.1667$; and $k_2=N_2 f_{s2}/f_{sm}$ thus, $k_2=(16*44$ kHz$)/768$ kHz$=0.9167$.

Finally, because the modulator 860 and digital combiner 840 frequencies are known, the upsampling factor, $N_z$, for the interpolator 850 can be determined through:

$f_{sd}=N_2*f_{sm}$; so that, $N_z=f_{sd}/f_{sm}$, thus, $N_z=3.072$ MHz$/768$ kHz$=4$.

Figure 8B:
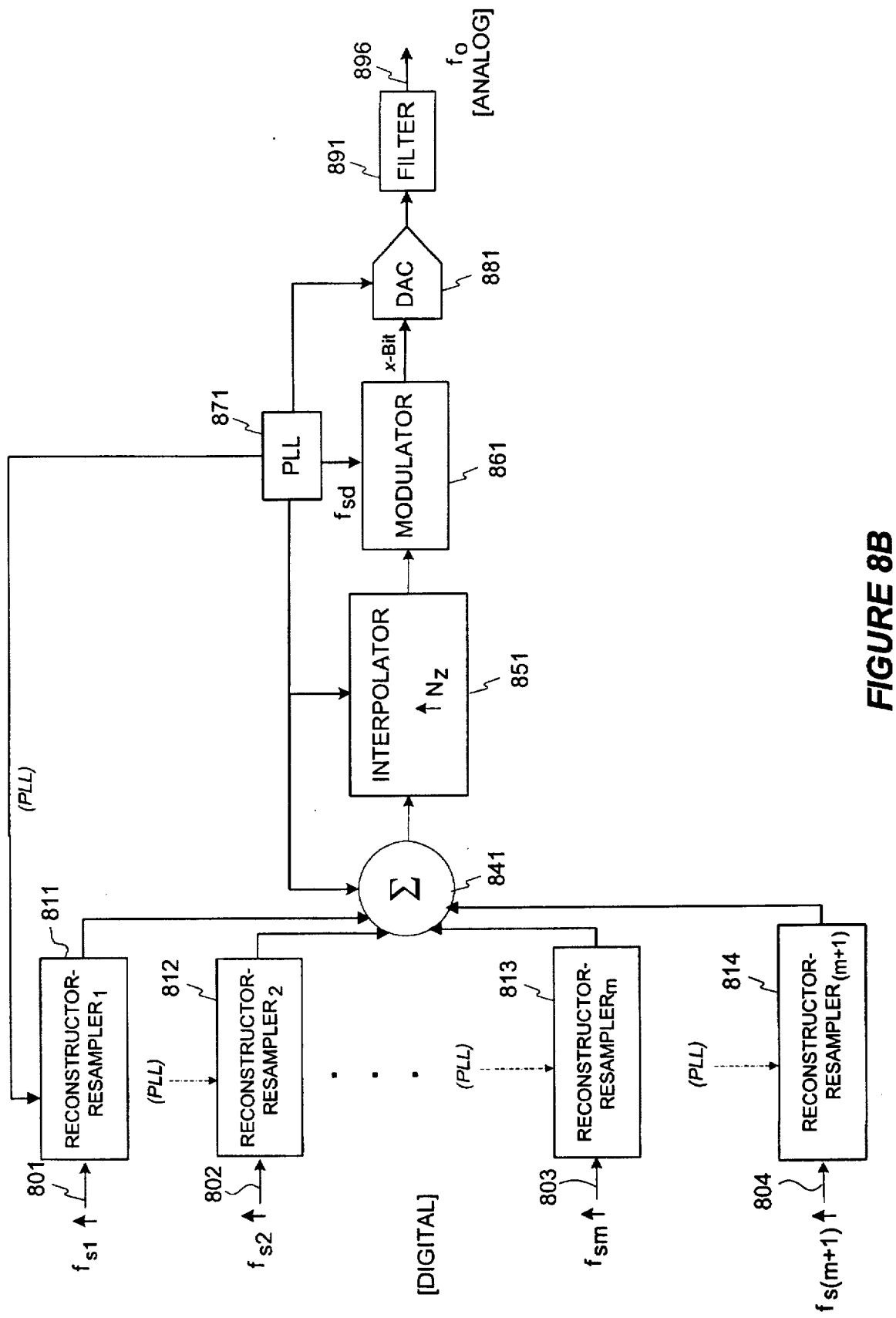
FIG. 8B is a block diagram of fourth embodiment of the converter system of the present invention where multiple digital inputs are converted to an analog output.

FIG. 8B illustrates a block diagram of a fourth embodiment of the present invention conversion system. The fourth embodiment comprises a first, a second, a mth, and a (m+1)th signal line inputs 801, 802, 803, 804, a digital combiner 841, an interpolator 851, a modulator 861, a digital-to-analog converter 881, a low-pass filter 891, a phase-locked loop 871, and a signal output line 896. Each of the first, the second, the mth, and the (m+1)th signal line inputs 801, 802, 803, 804 receives a digital data stream or signal that enters a respective reconstructor-resampler unit 811, 812, 813, 814 at an input and an output of each reconstructor-resampler unit 811, 812, 813, 814 is coupled to the input of the digital combiner 841. The remainder of the system, including the interpolator 851, the modulator 861, the digital-to-analog converter 881, the low-pass filter 891, the phase-locked loop 871, and the signal output line 896, is connected similar to FIG. 8A as described above.

Figure 8C:
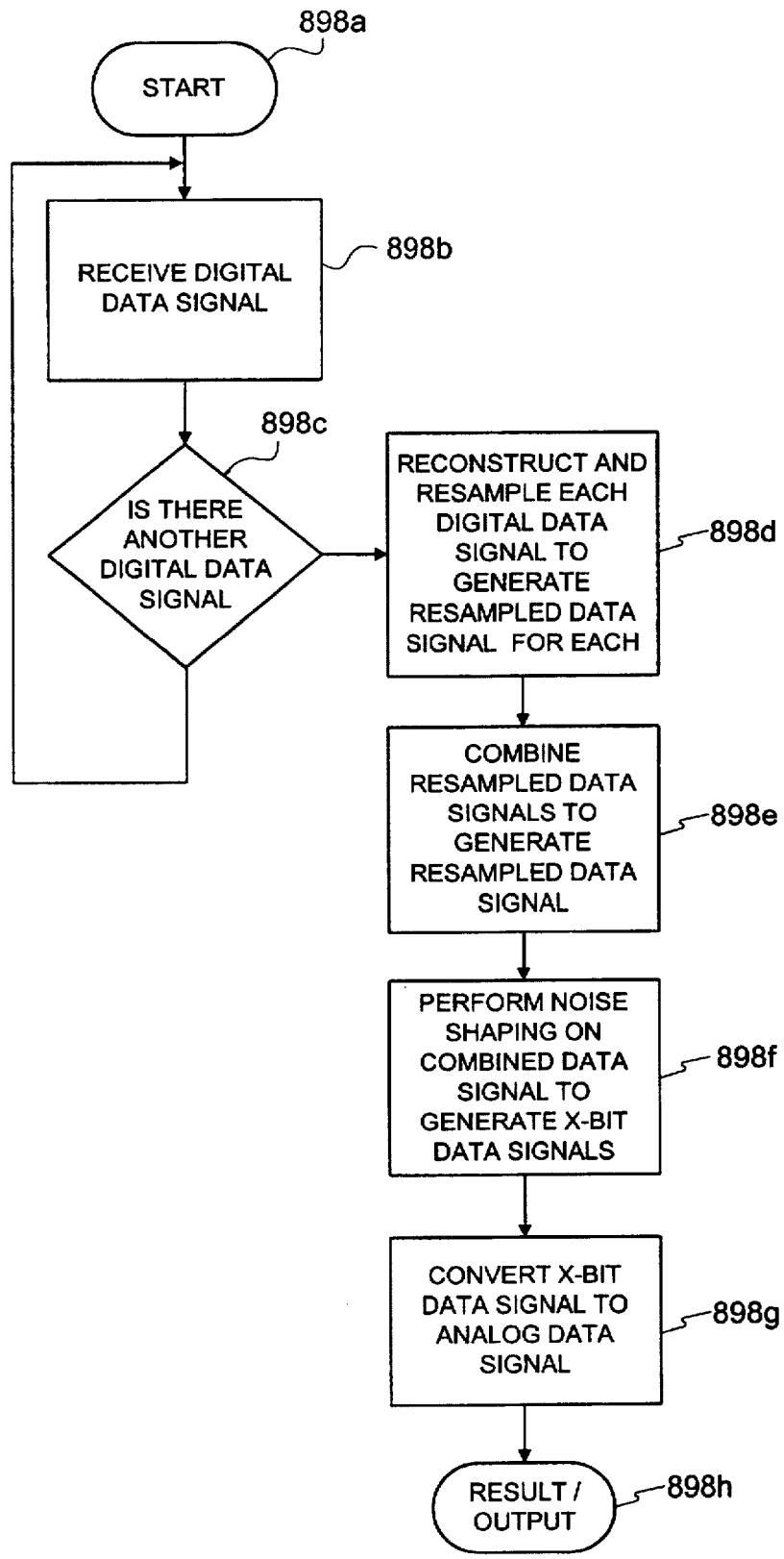
FIG. 8C is a flow diagram illustrating one method of operation of the present invention.

The components and system of the fourth embodiment of the present invention also function similar to the embodiment of FIG. 8A except that in the fourth embodiment m+1 digital data signals are combined and ultimately converted to an analog data signal. FIG. 8C is a flow diagram illustrating generally one method of operation of the present invention. When the system starts 898a operation, each digital data signal is received 898b,c at its own signal input line. Each data signal is then reconstructed and resampled 898d in its own reconstructor-resampler unit to generate a resampled data signal for each received digital data signal. The resampled data signals are combined 898e to form a combined data signal. The combined data signal is noise-shaped 898f to generate a x-bit data signal. The x-bit data signal is then converted 898g to an analog data signal that is then output 898h along the signal output line.

The advantage of the present invention is shown as the multiple digital data signals are converted to the analog data signal using the reconstructor-resampler units 811, 812, 813, 814 and operating the modulator 861 at a predetermined, or fixed, frequency regardless of an input sampling rate of the digital data signals. Therefore, the conversion system requires fewer hardware components, and in turn reduced chip surface area, lower processing power, and less system resources. Moreover, one skilled in the art will appreciate that hardware and process redundancy is eliminated by the present invention where multiple digital data streams are inputted into the conversion system.

In an alternative embodiment of the present invention, one skilled in the art can appreciate that a reconstructor-resampler may be built using conventional software and, if necessary, associated hardware.

Figure 9:
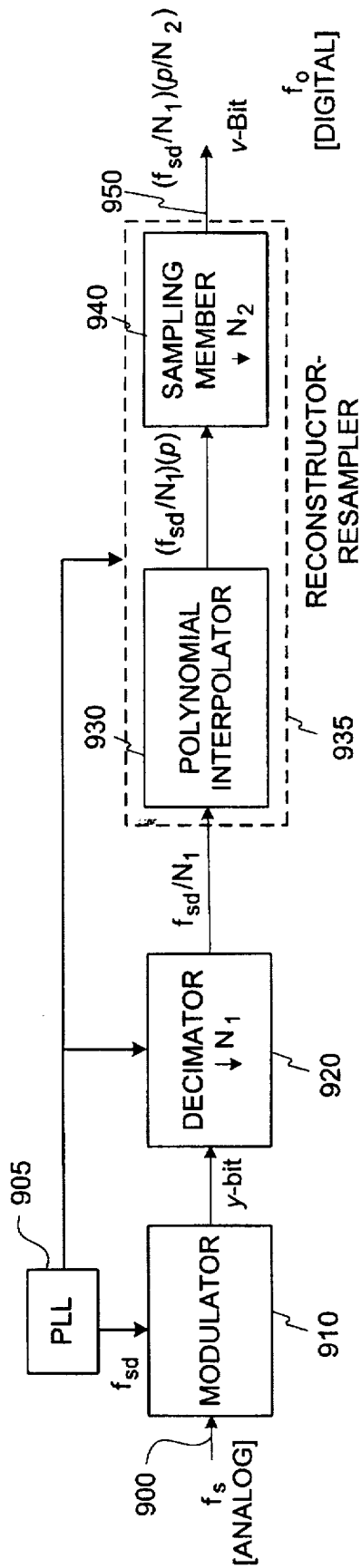
FIG. 9 is a block diagram of a fifth embodiment of the converter system of the present invention where an analog input is converted to a digital output.

Turning now to FIG. 9, a block diagram illustrates a fifth embodiment of the present invention where an analog data input stream or signal is converted to a digital data output stream or signal. The fifth embodiment includes a signal input line 900, a modulator 910, decimator 920, and a reconstructor-resampler unit 935, a phase-locked loop 905, and a signal output line 950. The reconstructor-resampler unit 935 is further comprised of a polynomial interpolator member 930 and a sampling member 940. The signal line input 900 is coupled to an input of the modulator 910. An output of the modulator is coupled to an input of the decimator 920 and an output of the decimator 920 is coupled to an input of the reconstructor-resampler unit 935. The input of the reconstructor-resampler unit 935 is an input of the polynomial interpolator member 930 of the reconstructor-resampler unit 935. An output of the polynomial interpolator member 930 is coupled to an input of the sampling member 940. An output of the sampling member is an output of the reconstructor-resampler unit 935 and is coupled to or serves as the signal output line 950. The phase-locked loop 905 provides a clock signal input frequency for the modulator 910, the decimator 920 and the reconstructor-resampler unit 935, respectively.

In the fifth embodiment of the present invention, an analog data input stream, $f_s$, enters or is received by the system through signal line input 900, and, is fed to the input of the modulator 910. The modulator 910 operates at frequency of $f_{sd}$, where $f_{sd}$ remains fixed, but is greater than the digital data output stream frequency, $f_o$. The modulator 910 incorporates an analog-to-digital converter that generates a y-bit data stream from the analog data signal. The y-bit data stream is fed into the input of the decimator 920. The decimator 920 downsamples the y-bit data stream $N_1$ times to produce a decimated data stream having a frequency of $f_{sd}/N_1$. A low-pass filter associated, or coupled, (but not shown) with the decimator 920 filters out high frequency noise produced by the modulation process.

The decimated data stream is fed into the reconstructor-resampler unit 935, and more specifically, to the input of the polynomial interpolator member 930. The polynomial interpolator member 930 performs a sampling rate conversion, using a curve-fitting operation as described above. As a result of this curve-fitting operation a $(f_{sd}/N_1)(p)$ data stream emerges from the polynomial interpolator member 930. The $(f_{sd}/N_1)(p)$ data stream is fed into the input of the sampling member 940 where it is downsampled $N_2$ times to achieve the desired output frequency. The sampling member 940 outputs a v-bit digital data output data stream, having a sampling frequency of $(f_{sd}/N_1)(p/N_2)$, onto the signal output line 950. The v-bit data stream in this embodiment may be a 16-bit data stream.

Figure 10A:
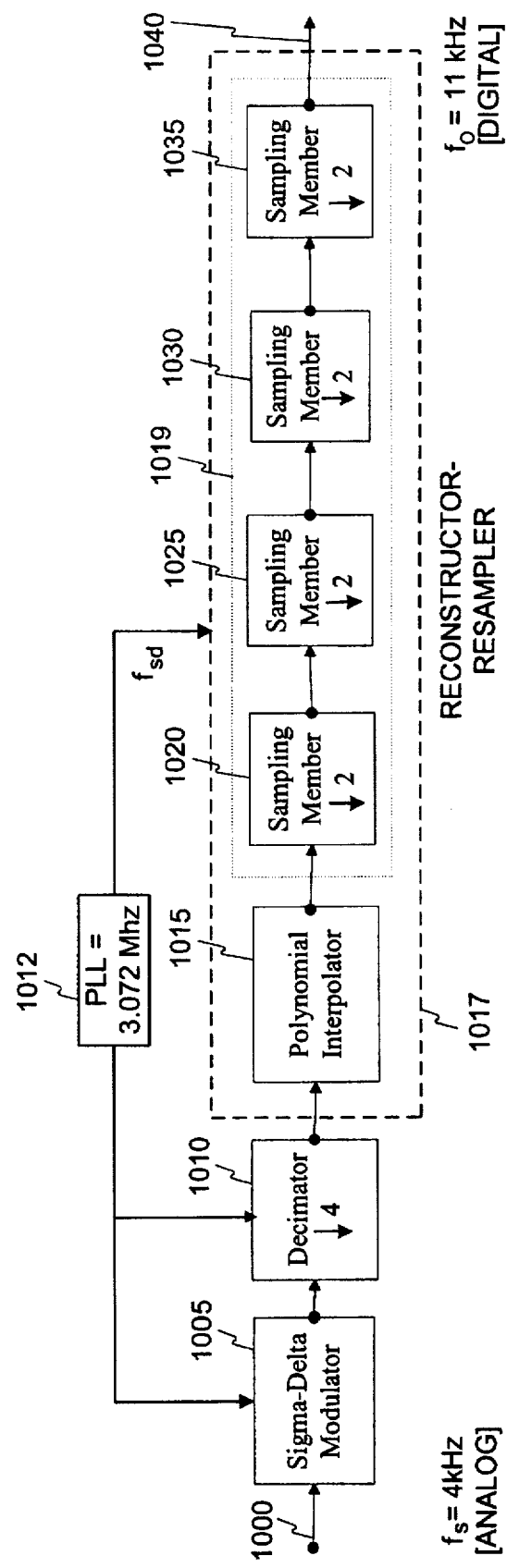
FIG. 10A is a block diagram of a sixth embodiment of the converter system of the present invention.

FIG. 10A is a block diagram of a sixth embodiment of the present invention. The sixth embodiment includes a signal input line 1000, a modulator 1005, a decimator 1010, a reconstructor-resampler unit 1017, a phase-locked loop 1012, and a signal output line 1040. The reconstructor-resampler unit 1017 includes a polynomial interpolator member 1015 and a sampling member 1019. The sampling member 1019 further includes a series of sub-sampling members 1020, 1025, 1030, and 1035.

The signal input line 1000 is coupled to an input of the modulator 1005 and an output of the modulator 1005 is coupled to an input of the decimator 1010. An output of the decimator is coupled to an input of the reconstructor-resampler unit 1017, and more specifically, to an input of the polynomial interpolator member 1015. An output of the polynomial interpolator member 1015 is coupled to an input of the sub-sampling member 1020. An output of the sub-sampling member 1020 is coupled to an input of the sub-sampling member 1025 and an output of the sub-sampling member 1025 is coupled to an input of the sub-sampling member 1030. An output of the sub-sampling member 1030 is coupled to an input of the sub-sampling member 1035. An output of the sub-sampling member 1035 serves as an output of the reconstructor-sampler unit 1017 and is coupled to or further serves as the signal output line 1040. The phase-locked loop 1012 provides a clock signal to clock the modulator 1005, the decimator 1010, and the reconstructor-resampler unit 1017 through a respective clock input of each device.

An example illustrating this embodiment of the present invention has the signal input line 1000 receive an analog data input stream that is a 4 kHz pure sine wave. The analog data input stream is fed into the input of the analog sigma-delta modulator 1005 that is operating at a fixed rate of 3.072 MHz, which is greater than the frequency of the digital data output stream. The modulator 1005, that includes an analog-to-digital converter, generates a one-bit data stream from the analog data input stream and feeds the one-bit data stream into the decimator 1010 that downsamples the data stream four times and filters it in a Comb low-pass filter. The downsampled data stream is then sent to the input of the reconstructor-resampler unit 1017, and more specifically to the input of the second-order polynomial interpolator member 1015 that resamples the data to a frequency that is 16 times the output sampling rate. In this embodiment of the present invention, the digital data output stream sampling rate is 11 kHz, so that the output rate of the polynomial interpolator is calculated to be 11 kHz*16 or 176 kHz.

The data stream generated by the polynomial interpolator member 1015 is further downsampled 16 times in the sampling member 1019, and more specifically, through the series of four sub-sampling members 1020, 1025, 1030, 1035. Each sub-sampling member 1020, 1025, 1030, 1035 downsamples two times and has a low-pass filter (not shown) for filtering the data stream before leaving the respective sub-sampling member. The output of the last sub-sampling member 1035 also serves as the output of the reconstructor-resampler unit 1017 and the conversion system and is a 16-bit digital data output stream having a sampling frequency of 11 kHz. This embodiment of the conversion system has many of the advantages and benefits described previously. In particular, this embodiment of the conversion system has the advantages of requiring fewer hardware components, reducing the necessary chip surface area, lowering the processing power needs, and using less system resources because hardware redundancy can be reduced or eliminated.

Figure 10B:
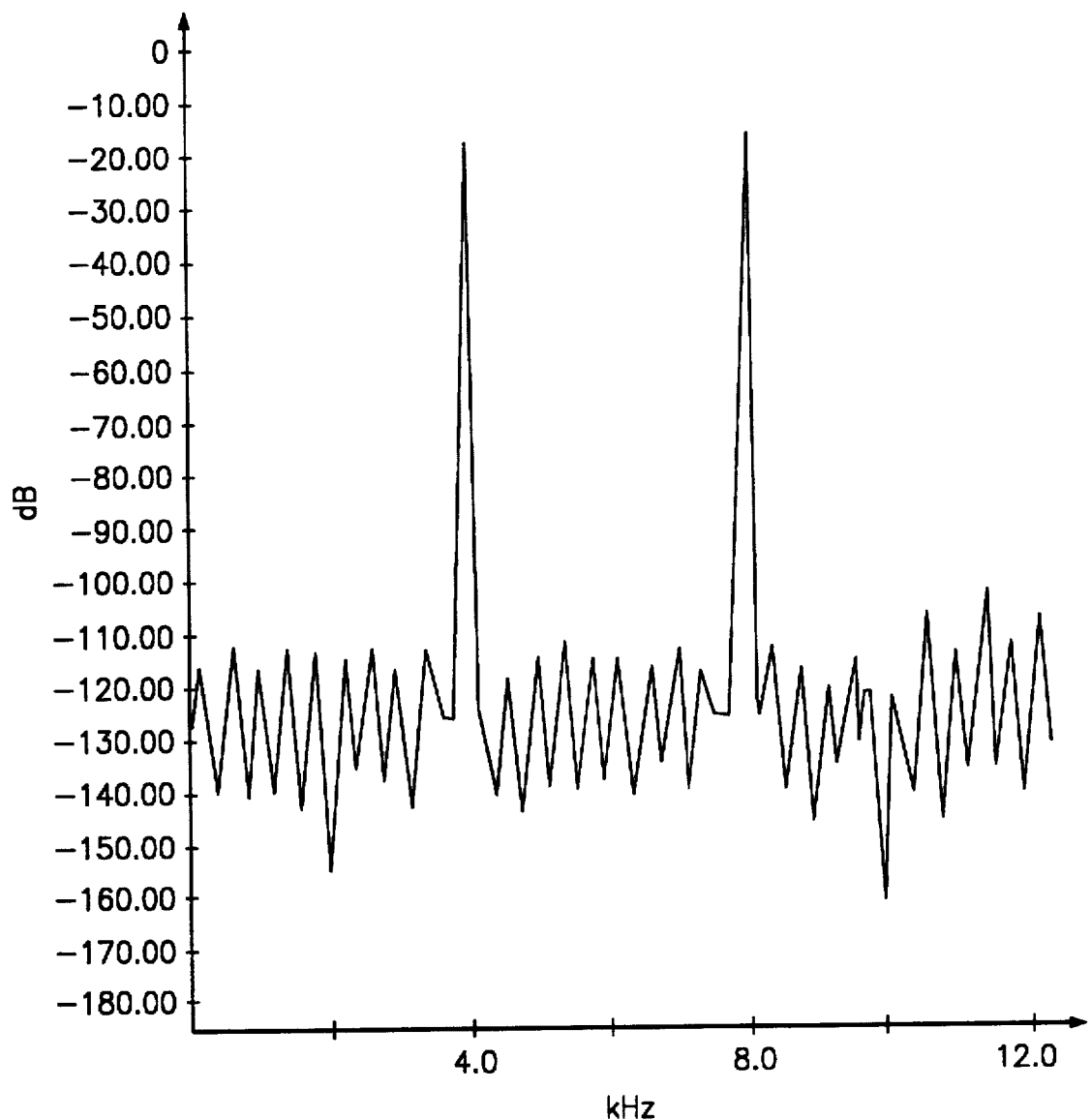
FIG. 10B is a graphical representation of the digital output using the fifth embodiment of the converter system of the present invention; and, FIG. 11 is a block diagram of a seventh embodiment of the converter system of the present invention.

FIG. 10B is a graphical representation of the digital data output stream using the sixth embodiment of the present invention conversion system.

Figure 11:
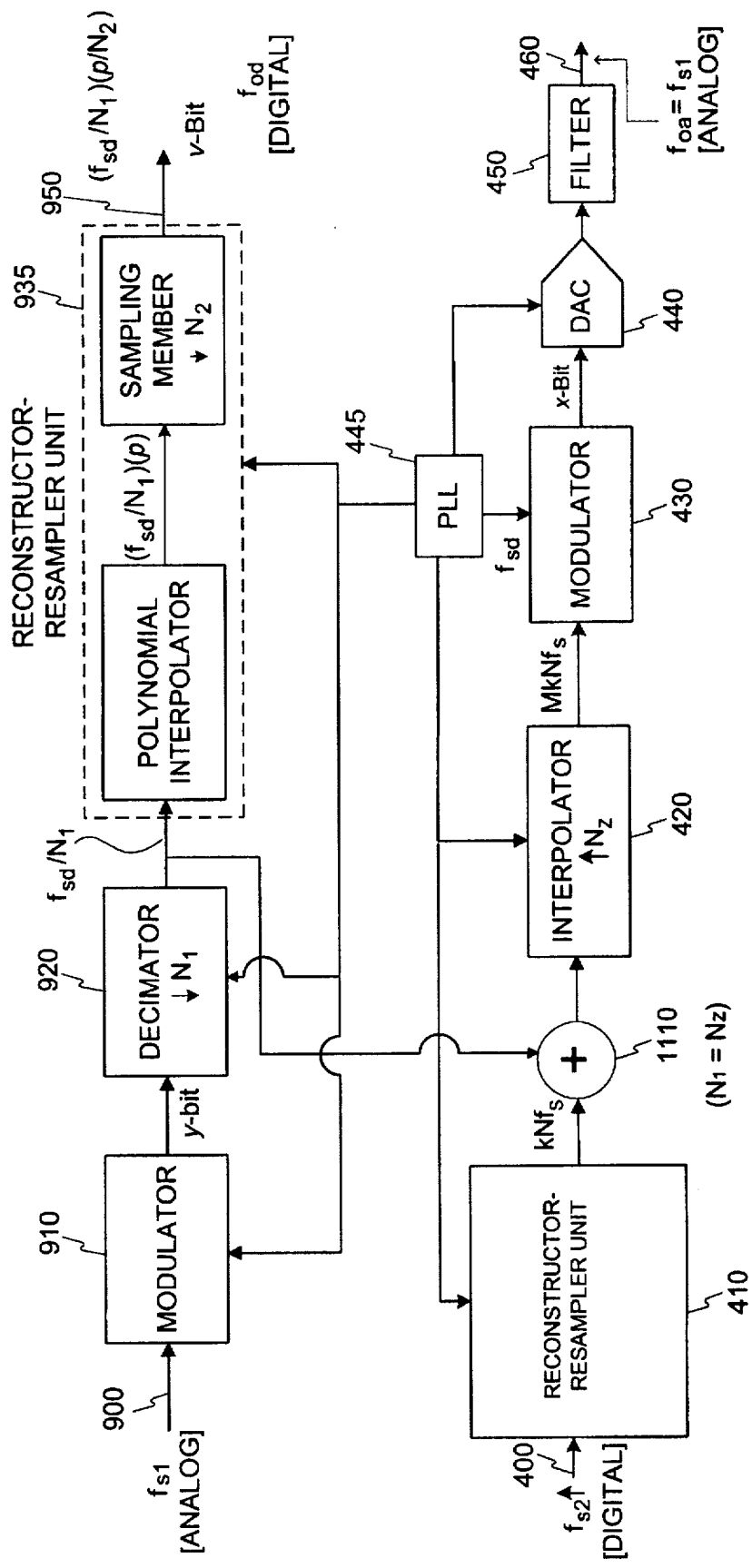

Referring now to FIG. 11, a block diagram illustrates a seventh embodiment of the present invention. The seventh embodiment includes a record-and-playback system that, for purposes of simplicity, may be described using the components and features of the first embodiment of the present invention illustrated in FIG. 4 and the fifth embodiment of the present invention illustrated in FIG. 9. The seventh embodiment also includes an adder 1110 that is coupled to the decimator 920, the reconstructor-resampler unit 410, and the interpolator 420.

In the seventh embodiment, an analog signal may be recorded as a digital signal representation. Simultaneously, it may be desired to monitor the analog signal being recorded. The analog signal, $f_{s1}$, enters along the signal input line 900 and passes through the modulator 910 and the decimator 920 as discussed in the fifth embodiment of FIG. 9. Moreover, the downsampling rate, $N_1$, is set equal to the upsampling rate, $N_z$, of the modulator 420. The downsampled data stream that emerges from the decimator 920 has a sampling frequency of $f_{sd}/N_1=f_{sd}/N_z$ and is sent along two separate lines. The first line continues onto the reconstructor-sampler unit 935 and to the signal output line 950 as described in the fifth embodiment.

The second line from the decimator 920 couples to the adder 1110 where it is mixed with the output from the reconstructor-resampler unit 410 of the digital-to-analog conversion system. In the digital-to-analog conversion system a digital signal, $f_{s2}$, is the signal that is used to monitor the analog signal recording. The digital signal, $f_{s2}$, enters the reconstructor-resampler unit 410 along signal input line 400 where it is operated on as discussed in the first embodiment illustrated in FIG. 4. The output from the reconstructor-resampler unit 410 has a sampling frequency of $kNf_{s2}$ that equals the sampling frequency of the data stream from the decimator 920, $f_{sd}/N_1$, so that the two data streams can be mixed in the adder 1110. The data stream that emerges from the adder 1110 enters the interpolator 420 and then continues through the digital-to-analog conversion system as described in the first embodiment. The resultant analog output signal, $f_{oa}=f_{s1}$, at the signal output line 460 of the digital-to-analog conversion system is a reproduction of the analog input signal, $f_{s1}$, at the signal input line 900 of the analog-to-digital conversion system.

In yet an alternative embodiment of the present invention, if there is no monitoring of the input analog signal, $f_{s1}$, entering the analog-to-digital conversion system, then there is no need for the digital signal entering the digital-to-analog conversion system and the output from the decimator 920 is sent to the adder 1110 and onto the interpolator 420.

The seventh embodiment illustrates the advantages of the present invention. By using the reconstructor-resampler unit 410, 935, each modulator 910, 430 may be operated at a fixed frequency and the system requires only one system clock, shown here as the phase-locked loop 445, for both the analog-to-digital conversion system used for recording and the digital-to-analog conversion system used for playback. Therefore, the present invention provides a benefit of providing analog-to-digital conversion and digital-to-analog conversion without the increased costs associated with additional system components that also consume valuable chip surface area. Moreover, because of the reconstructor-resampler unit 410, 935 the sampling frequency from the analog-to-digital output, $f_{od}$, does not have to equal the sampling frequency of the digital-to-analog input, $f_{s2}$, during the record and playback operation.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. In a digital-to-analog conversion system including an input of a digital data signal, having a sampling frequency, and including a digital-to-analog converter and a modulator operating at a fixed clock rate regardless of the sampling frequency, a method to convert the digital data signal to an analog data signal comprising the steps of:

receiving the digital data signal at a signal input line;

reconstructing and resampling the digital data signal to generate a resampled data signal, the reconstructing and resampling further comprising
  upsampling the digital data signal to generate an upsampled digital data signal; and
  curve-fitting the upsampled digital data signal using polynominal interpolation to generate the resampled data signal;

performing noise-shaping on the resampled data signal to generate a x-bit data signal;

converting the x-bit digital data signal to the analog data signal; and outputting the analog data signal.

2. The method as in claim 1, wherein the curve-fitting step further comprises the step of performing a second-order polynomial interpolation to generate the resampled data signal.

3. The method as in claim 2, wherein the converting step further comprises the step of filtering the analog data signal through a low-pass filter.

4. In a digital-to-analog conversion system including a digital-to-analog converter and a modulator operating at a predetermined frequency, a method to convert the first and the second digital data signals to an analog data signal, the method comprising the steps of:

receiving a first digital data signal and a second digital data signal;

reconstructing and resampling the first digital data signal to generate a first resampled data signal and reconstructing and resampling the second digital data signal to generate a second resampled data signals reconstructing and resampling including
  upsampling the first digital data signal to generate a first upsampled digital data signal and upsampling the second digital data signal to generate a second upsampled digital data signal; and
  curve-fitting the first upsampled digital data signal to generate the first resampled data signal and curve-fitting the second upsampled digital data signal to generate the second resampled data signal;

combining the first resampled data signal and the second resampled data signal to generate a combined resampled data signal;

performing noise-shaping on the combined resampled data signal to generate a x-bit digital data signal;

converting the x-bit digital data signal to the analog data signal; and outputting the analog data signal.

5. The method as in claim 4, wherein the curve-fitting step further comprises the steps of performing a first second-order polynomial interpolation to generate the first upsampled data signal and performing a second second-order polynomial interpolation to generate the second resampled data signal.

6. The method as in claim 5, further comprising the step of upsampling the resampled data signal.

7. The method as in claim 5, wherein the converting step further comprises the step of filtering the analog data signal through a low-pass filter.

8. A digital-to-analog conversion system, for converting a digital data signal, having a sampling frequency, to an analog data signal, the system comprising:

a reconstructor-resampler, having an input and an output, for a sampling rate conversion of the digital data signal to generate a resampled data signal, the input of the reconstructor-resampler coupled to receive the digital data signal, the reconstructor-resampler including
  a sampling member, having an input and an output for upsampling the digital data signal to generate an upsampled digital data signal the input of the sampling member coupled to receive the digital data signal input into the reconstructor-resampler; and
  a polynomial interpolator, having an input and an output for interpolating the upsampled digital data signal to generate the resampled data signal the input of the polynomial interpolator coupled to the output of the sampling member and the output of the polynomial interpolator coupled as the output from the reconstructor-resampler;

a modulator, having an input, an output, and a clock signal input, for performing noise-shaping on the resampled data signal to generate a x-bit data signal, the input of the modulator coupled to the output of the reconstructor-resampler to receive the resampled data signal, the clock input of the modulator coupled to receive a clock signal for operating the modulator at a predetermined clock rate; and, a digital-to-analog converter, having an input and an output for converting the x-bit data signal to generate an analog data signal, the input of the digital-to-analog converter coupled to the output of the modulator for receiving the x-bit data signal and the output of the digital-to-analog converter coupled to output the analog data signal.

9. The digital-to-analog conversion system as in claim 8, wherein the polynomial interpolator is a second-order polynomial interpolator.

10. The digital-to-analog conversion system as in claim 8, further comprising an interpolator, having an input and an output, for upsampling the resampled data signal, the input of the interpolator coupled to the output of the reconstructor-resampler, and the output of the interpolator coupled to the input of the modulator.

11. The digital-to-analog conversion system as in claim 9, wherein the digital-to-analog converter includes a low-pass filter for filtering the analog data signal.

12. A digital-to-analog conversion system for converting a first digital data signal, having a first sampling frequency, and a second digital data signal, having a second sampling frequency, to an analog data signal, the system comprising:

a first reconstructor-resampler, having an input and an output, for sampling rate conversion of the first digital data signal to generate a first resampled data signal, the input of the first reconstructor-resampler coupled to receive the first digital data signal;

a second reconstructor-resampler, having an input and an output, for a sampling rate conversion of the second digital data signal to generate a second resampled data signal, the input of the second reconstructor-resampler coupled to receive the second digital data signal;

a combiner, having a first input, a second input, and an output, for combining the first resampled data signal and the second resampled data signal to generate a combined data signal, the first input of the combiner coupled to the output of the first reconstructor-resampler for receiving the first resampled data signal and the second input of the combiner coupled to the output of second reconstructor-resampler for receiving the second resampled data signal;

a modulator, having an input, an output and a clock signal input, for performing noise-shaping on the combined data signal to generate a x-bit data signal, the input of the modulator coupled to the output of the combiner to receive the combined data signal, the clock input of the modulator coupled to a clock for operating the modulator at a predetermined frequency; and a digital-to-analog converter, having an input and an output, for converting the x-bit data stream to the analog data signal, the input of the digital-to-analog converter coupled to the output of the modulator for receiving the x-bit data stream and the output of the digital-to-analog converter coupled to output the analog data signal.

13. The digital-to-analog conversion system as in claim 12, wherein the first reconstructor-resampler comprises:

a first sampling member, having an input and an output, for upsampling the first digital data signal to generate a first upsampled digital data stream, the input of the first sampling member coupled to receive the input of the first reconstructor-sampler; and a first polynomial interpolator, having an input and an output, for interpolating the first upsampled digital data signal to generate the first resampled data signal, the input of the first polynomial interpolator coupled to the output of the first sampling member and the output of the first polynomial interpolator coupled to output the output of the first reconstructor-resampler.

14. The digital-to-analog conversion system as in claim 12, wherein the second reconstructor-resampler comprises:

a second sampling member, having an input and an output, for upsampling the second digital data signal to generate a second upsampled digital data signal, the input of the second sampling member coupled to receive the input of the second reconstructor-resampler; and a second polynomial interpolator, having an input and an output, for interpolating the second upsampled digital data signal to generate the second resampled data signal, the input of the second polynomial interpolator coupled to the output of the second sampling member and the output of the second sampling member coupled to output the output of the second reconstructor-resampler.

15. The digital-to-analog conversion system as in claim 13, wherein the first polynomial interpolator is a second-order polynomial interpolator.

16. The digital-to-analog conversion system as in claim 14, wherein the second polynomial interpolator is a second-order polynomial interpolator.

17. The digital-to-analog conversion system as in claim 12, wherein the digital to analog converter includes a low-pass filter for filtering the analog data signal.

18. In an analog-to-digital conversion system, including an input of an analog data signal, and having a modulator operating at a predetermined frequency, a method to convert an analog data signal to a digital data signal having a sampling frequency, the method comprising the steps of:

receiving the analog data signal at a signal input line;

performing noise-shaping on the analog data signal to generate a y-bit data signal;

reconstructing and resampling the y-bit data stream to generate a v-bit data signal having the sampling frequency and outputting the v-bit data signal on a signal output line.

19. The method as in claim 18, wherein the reconstructing and resampling step further comprises the steps of:

curve-fitting the y-bit data signal using polynomial interpolation to generate an interpolated data signal; and downsampling the interpolated data signal to generate the v-bit data signal.

20. The method as in claim 19, wherein the curve-fitting step further comprises the step of performing a second-order polynomial interpolator to generate the interpolated data signal.

21. The method as in claim 18, further comprising the step of downsampling the y-bit data signal.

22. An analog-to-digital conversion system for converting an analog data signal to a digital data signal having a sampling frequency, the system comprising:

a modulator, having an input, an output, and a clock signal input for performing noise-shaping on the analog data signal to generate a y-bit data signal, the input of the modulator coupled to receive the analog data signal, and the clock input of the modulator coupled to receive a clock signal for operating the modulator at a predetermined frequency; and, a reconstructor-resampler, having an input and an output, for a sampling rate conversion of the y-bit data signal to generate a v-bit data signal, the input of the reconstructor-resampler coupled to the output of the modulator and the output of the reconstructor-resampler coupled to output the v-bit digital data signal.

23. The analog-to-digital conversion system as in claim 22, wherein the reconstructor-resampler further comprises:

a polynomial interpolator, having an input and an output, for interpolating the y-bit data signal to generate the interpolated data signal, the input of the polynomial interpolator coupled to receive the input of the reconstructor-sampler; and a sampling member, having an input and an output, for downsampling the interpolated data signal to generate the v-bit data signal, the input of the sampling member coupled to output of the reconstructor-resampler and the output of the sampling member coupled to output the output of the reconstructor-resampler.

24. The analog-to-digital conversion system as in claim 23, wherein the polynomial interpolator is a second-order polynomial interpolator.

25. A conversion system, including a digital data signal having a sampling frequency and an analog data signal, the system comprising:

a means for reconstructing and resampling the digital data signal to generate a resampled data signal, the means for reconstructing and resampling further including
a means for upsampling the digital data signal to generate an upsampled data signal; and
a means for curve-fitting the upsampled data signal to generate the resampled data signal;

a means for performing noise-shaping on the resampled data signal to generate a x-bit data signal; and a means for converting the x-bit data signal to generate an analog data signal.

26. The conversion system as in claim 25, wherein the means for curve-fitting further comprises a means for a second-order polynomial interpolation of the upsampled data signal to generate the resampled data signal.

27. The conversion system as in claim 26, wherein the means for converting further comprises a means for filtering the analog data signal.

28. A conversion system, including a first digital data signal having a first sampling frequency, a second digital data signal having a second sampling frequency and an analog data signal, the system comprising:

a means for reconstructing and resampling the first digital data signal to generate a first resampled data signal and the second digital data signal to generate a second resampled data signal, the means for reconstructing and resampling including a means for upsampling the first digital data signal to generate a first upsampled data signal and the second digital data signal to generate a second upsampled data signal; and a means for curve-fitting the first upsampled data signal to generate the first resampled data signal and the second upsampled data signal to generate the second resampled data signal;

a means for combining the first resampled data signal and the second resampled data signal to generate a combined data signal;

a means for performing noise-shaping on the combined data signal to generate a x-bit data signal; and, a means for converting the x-bit data signal to generate an analog data signal.

29. The conversion system as in claim 28, wherein the means for curve-fitting further comprises a means for a second-order polynomial interpolation of the first upsampled data signal to generate the first resampled data signal and the second upsampled data signal to generate the second resampled data signal.

30. The conversion system as in claim 28, wherein the means for converting further comprises a means for filtering the analog data signal.

31. In a conversion system for converting a digital data signal to an analog data signal, a reconstructor-resampler comprising:

a sampling member, having an input and an output, for upsampling the digital data signal received at the input; and a second-order polynomial interpolator member, having an input and an output, for interpolating the upsampled digital data signal, the input of the polynomial interpolator coupled to the output of the sampling member.

32. In a conversion system for converting an analog data signal to a digital data signal, a reconstructor-resampler comprising:

a polynomial interpolator member, having an input and an output, for interpolating a digitized data stream, the input of the polynomial interpolator coupled to a modulator; and a sampling member, having an input and an output, for downsampling the interpolated data stream, the input of the sampling member coupled to the output of the polynomial interpolator and the output of the sampling member outputting the digital data signal.

33. The reconstructor-resampler as in claim 32, wherein the polynomial interpolator member is a second-order polynomial interpolator member.

* * * * *

UNITED STATES PATENT AND TRADEMARK OFFICE
CERTIFICATE OF CORRECTION

PATENT NO.    : 5,748,126

DATED         : May 5, 1998

INVENTOR(S)   : Chingwo Ma, et al.

It is certified that error appears in the above-identified patent and that said Letters Patent is hereby corrected as shown below:

In column 18, line 11, replace "signals" with - - signal, the - -.

In column 18, line 50, replace "signal" with - - signal, - -.

In column 18, line 54, replace "output" with - - output, - -.

Signed and Sealed this

Twenty-eighth Day of July, 1998

Attest:

BRUCE LEHMAN

*Attesting Officer*            *Commissioner of Patents and Trademarks*